United States Patent
Noh

(10) Patent No.: US 9,728,448 B1
(45) Date of Patent: Aug. 8, 2017

(54) METHOD OF MANUFACTURING SEMICONDUCTOR DEVICE

(71) Applicant: SK hynix Inc., Gyeonggi-do (KR)

(72) Inventor: Yoo Hyun Noh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/173,407

(22) Filed: Jun. 3, 2016

(30) Foreign Application Priority Data

Jan. 19, 2016 (KR) .................... 10-2016-0006593

(51) Int. Cl.
| | | |
|---|---|---|
| H01L 21/768 | (2006.01) | |
| H01L 27/11556 | (2017.01) | |
| H01L 27/11582 | (2017.01) | |
| H01L 27/11573 | (2017.01) | |
| H01L 27/11526 | (2017.01) | |
| H01L 23/528 | (2006.01) | |

(52) U.S. Cl.
CPC .... *H01L 21/76838* (2013.01); *H01L 23/5283* (2013.01); *H01L 27/11526* (2013.01); *H01L 27/11556* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 9,356,034 B1* | 5/2016 | Yada | H01L 27/11575 |
| 9,431,336 B2* | 8/2016 | Lim | H01L 23/50 |
| 2016/0365352 A1* | 12/2016 | Nishikawa | H01L 27/11582 |

FOREIGN PATENT DOCUMENTS

| | | |
|---|---|---|
| KR | 1020130072522 | 7/2013 |
| KR | 1020140008622 | 1/2014 |

* cited by examiner

*Primary Examiner* — Reema Patel
*Assistant Examiner* — Steven Christopher
(74) *Attorney, Agent, or Firm* — IP & T Group LLP

(57) ABSTRACT

Disclosed is a method of manufacturing a semiconductor device, including: forming a stacked structure including a plurality of layers, the stacked structure including a cell region, and first and second contact regions; forming a first mask pattern covering the cell region and the second contact region of the stacked structure; forming steps of n layers at a boundary of the cell region and the first contact region, where n is a natural number greater than or equal to 1; forming a second mask pattern on the stacked structure, wherein the second mask pattern covers the cell region and the formed steps and is expanded to partially cover the first and second contact regions; and etching the stacked structure by k layers by using the second mask pattern as an etch barrier, where k is a natural number greater than or equal to 2.

15 Claims, 25 Drawing Sheets

METHOD OF MANUFACTURING SEMICONDUCTOR DEVICE

CROSS-REFERENCE TO RELATED APPLICATION

The present application claims priority under 35 U.S.C. §119(a) to Korean patent application number 10-2016-0006593 filed on Jan. 19, 2016, in the Korean Intellectual Property Office, which is incorporated herein in its entirety by reference.

BACKGROUND

1. Field

The present disclosure relates to a method of manufacturing an electronic device and, more particularly, to a method of manufacturing a three dimensional (3D) semiconductor device.

2. Description of the Related Art

A non-volatile memory device is a memory device in which stored data is maintained even when the power supply to the device is turned off. Recently, improvement of the degree of integration of two-dimensional (2D) memory devices, in which memory cells are formed in a single layer on a silicon substrate, has reached a limit. For further enhancing the degree of integration of memory devices, a three dimensional (3D) non-volatile memory device, in which a plurality of memory cells are vertically stacked on a silicon substrate, has been suggested.

A 3D non-volatile memory device typically includes a plurality of interlayer insulating layers and word lines which are alternately stacked. Channel layers pass through the interlayer insulating layer and the word lines, and memory cells are stacked along the channel layers. Patterning the word lines in a step form has been proposed for some time, wherein contact plugs and metal wires are formed to connect to the word lines so that each of the word lines may be readily controlled.

However, heretofore, it has been highly difficult to pattern the word lines in a step form. Also, a step structure occupies a large area, so it places a limit in improving the integration density of 3D memory devices.

SUMMARY OF THE INVENTION

The present disclosure addresses these and other problems associated with the prior art, and provides an improved, easier method of manufacturing a semiconductor device allowing an enhanced degree of integration.

An exemplary embodiment of the present disclosure provides a method of manufacturing a semiconductor device, including: forming a stacked structure including a plurality of layers, the stacked structure including a cell region, and first and second contact regions positioned at either side of the cell region; forming a first mask pattern covering the cell region and the second contact region of the stacked structure, while leaving exposed the first contact region; forming a step of n layers at a boundary of the cell region and the first contact region by etching the stacked structure by the n layers by using the first mask pattern as an etch barrier, where n is a natural number greater than or equal to 1; forming a second mask pattern on the stacked structure, wherein the second mask pattern covers the cell region and the steps and is expanded to partially cover the first and second contact regions, on the stacked structure; and etching the stacked structure by k layers by using the second mask pattern as an etch barrier, where k is a natural number greater than or equal to 2.

Another exemplary embodiment of the present disclosure provides a method of manufacturing a semiconductor device, including: forming a stacked structure, which includes a cell region, first to $m^{th}$ contact regions positioned at one side of the cell region, and $m+1^{th}$ to $2m^{th}$ contact regions positioned at the other side of the cell region, and in which a plurality of layers are stacked, where m is a natural number greater than or equal to 2; forming a first mask pattern covering the cell region and the $m+1^{th}$ to $2m^{th}$ contact regions of the stacked structure, and exposing the first to $m^{th}$ contact regions; forming a step of n layers by etching the stacked structure by the n layers, where n is a natural number greater than or equal to 1, by using the first mask pattern as an etch barrier, wherein the step is located at boundaries of the cell region and the first to $m^{th}$ contact regions; forming a second mask pattern on the stacked structure, wherein the second mask pattern covers the cell region and the step and is expanded to partially cover the first to $2m^{th}$ contact regions; repeatedly performing a process of etching the stacked structure by 2n layers by using the second mask pattern as an etch barrier several times while, at each repetition, decreasing the second mask pattern in a first direction so that the exposure of the first to $m^{th}$ contact regions and the $m+1^{th}$ to $2m^{th}$ contact regions is increased; forming a third mask pattern covering the cell region, the second to $m^{th}$ contact regions, and the $m+2^{th}$ to $2m^{th}$ contact regions of the stacked structure; and repeatedly performing a process of partially etching the stacked structure by using the third mask pattern as an etch barrier while, at each repetition, decreasing the third mask pattern in a second direction crossing the first direction so that the second to $m^{th}$ contact regions and the $m+2^{th}$ to $2m^{th}$ contact regions are sequentially exposed.

According to the exemplary embodiments of the present disclosure, the stacked structure is patterned in a step form by forming a step between the cell region and the contact region, so that it is possible to distribute and dispose pad portions of the stacked layers at both sides of the cell region. Accordingly, it is possible to decrease an area of the contact region and improve a degree of integration of a memory device.

BRIEF DESCRIPTION OF THE DRAWINGS

Example embodiments will now be described more fully hereinafter with reference to the accompanying drawings wherein.

FIGS. 3A and 3B to FIGS. 7A and 7B are diagrams illustrating a method of manufacturing the semiconductor device, according to an embodiment of the present disclosure.

FIGS. 8A and 8B to FIGS. 11A and 11B are diagrams illustrating a method of manufacturing the semiconductor device, according to an embodiment of the present disclosure.

DETAILED DESCRIPTION OF THE INVENTION

Figure 1A:
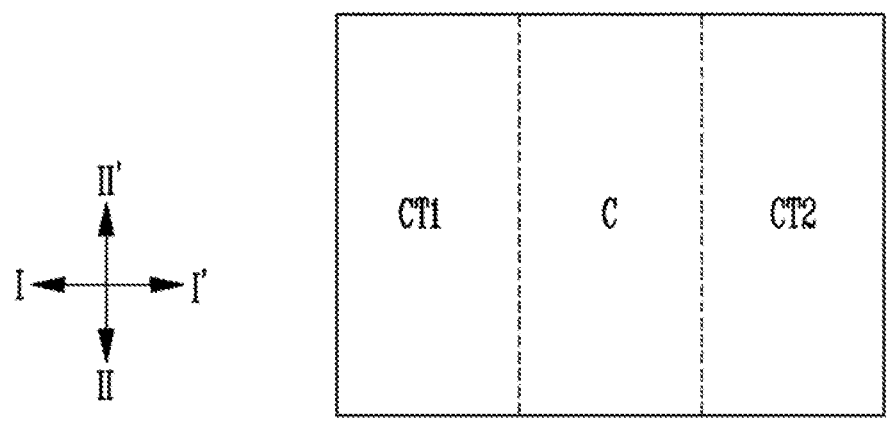
FIGS. 1A and 1B are layouts of a semiconductor device, according to an embodiment of the present disclosure.

Hereinafter, exemplary embodiments of the present disclosure will be described. However, we note that the invention may be embodied in different forms and should not be construed as being limited to the embodiments set forth herein. Rather, these embodiments are provided so that this disclosure will be thorough and complete, and will fully convey the scope of the example embodiments to those skilled in the art.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "Includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

In the drawings, the thicknesses and the intervals of elements are exaggerated for convenience of illustration, and may be exaggerated compared to an actual physical thickness. In describing the present disclosure, a publicly known configuration irrelevant to the principal point of the present disclosure may be omitted. It should note that in giving reference numerals to elements of each drawing, like reference numerals refer to like elements even though like elements are shown in different drawings.

Figure 1B:
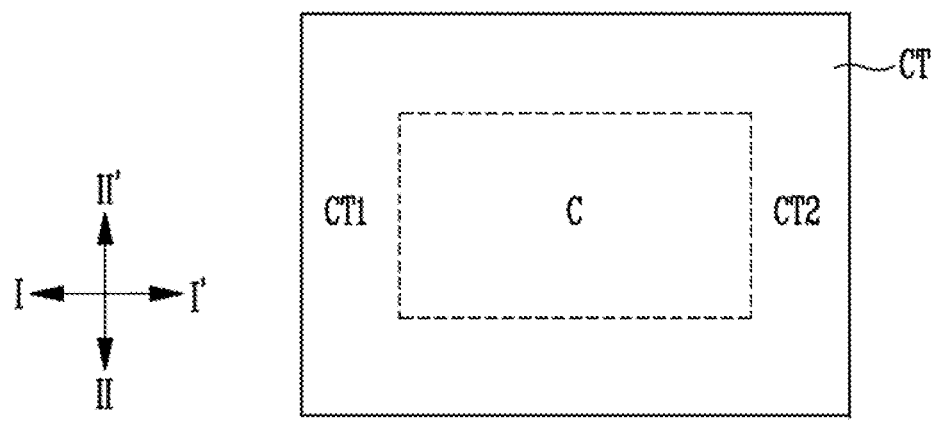

FIGS. 1A and 1B are layouts of a semiconductor device, according to an embodiment of the present disclosure.

Referring to FIGS. 1A and 1B, the semiconductor device may include a stacked structure including a cell region C and a contact region CT. In the cell region C, a plurality of memory cells are three-dimensionally stacked on a substrate. More specifically, although not illustrated in the present drawing, one or more memory strings may be positioned in the cell region C. Each memory string may include at least one drain select transistor, a plurality of memory cells, and at least one source select transistor, which may be connected in series, in the recited order. The memory strings may be arranged in a straight form, a U-shape, and a W-shape protruding substantially vertically (for the straight and U-shape strings) or at an angle (for the W-shape strings) relative to a horizontal plane of the substrate.

In the contact regions CT, CT1, and CT2, an interconnection for driving each of the stacked memory cells, an interconnection for connecting the cell array and a peripheral circuit may be positioned. Other interconnections and or circuits may also be positioned in the contact regions. An interconnection may be or include a contact plug, a wire, and the like. Further, the contact region CT of the stacked structure may be patterned in a step form so as to apply a bias to each of the stacked memory cells.

Referring to FIG. 1A, the first and second contact regions CT1 and CT2 may be positioned at both sides of the cell region C. In this case, the first contact region CT1, the cell region C, and the second contact region CT2 may be sequentially disposed in a first direction I-I'. Accordingly, among the four lateral walls, two lateral walls of the stacked structure, on which the first contact region CT1 and the second contact region CT2 are positioned, may have step forms. Here, the first direction I-I' may be a word line direction, and a second direction II-II' may be a bit line direction.

Referring to FIG. 1B, the contact region CT may be disposed so as to surround a circumference of the cell region C. In this case, four lateral walls of the stacked structure may have step forms similar to a pyramid. Further, a cross-section in the first direction I-I' and or a cross-section in the second direction II-II' may have a structure, in which the cell region C is disposed between the contact regions CT1 and CT2, as similar to those shown in FIG. 1A.

FIGS. 2A to 2H are side cross-sectional views for describing a method of manufacturing of the semiconductor device according to an embodiment of the present disclosure. FIGS. 2A to 2H are cross-sectional views taken along line I-I' of FIG. 1A or 1B.

Figure 2A:
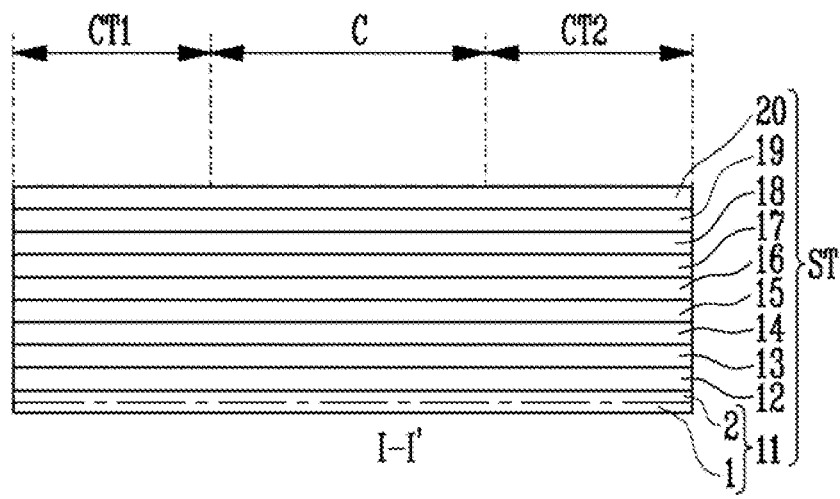
FIGS. 2A to 2H are cross-sectional views for describing a method of manufacturing the semiconductor device, according to an embodiment of the present disclosure.

Referring to FIG. 2A, a stacked structure ST including of plurality of layers 11 to 20 stacked on top of one another is formed. The stacked structure ST may include alternately stacked layers of first and second material layers 1 and 2, and each of the layers 11 to 20 may have a structure, in which the first and second material layers 1 and 2 are stacked. In an embodiment, each of the layers 11 to 20 may include the first material layer 1 at a lower side and the second material layer 2 at an upper side. In another embodiment, each of the layers 11 to 20 may include the first material layer 1 at an upper side and the second material layer 2 at a lower side.

The first material layer 1 may be provided for forming a word line electrically connected with a gate electrode of the memory cell or a select line electrically connected with a gate electrode of the select transistor. The second material layer 2 may be provided for insulating the stacked word lines or select lines from each other. The first material layer 1 may be formed of a material having higher etch selectivity relatively to the second material layer 2. For example, the first material layer 1 may be a sacrificial layer including a nitride, whereas the second material layer 2 may be an insulating layer including an oxide. In this case, the sacrificial layers may be replaced with conductive layers in a subsequent process. As another example, the first material layer 1 may be a conductive layer including a conductive material, such as, for example, polysilicon, whereas the second material layer 2 may be an insulating layer including an insulating material, such as, for example, an oxide. In this case, the conductive layers may be silicided in a subsequent process. As yet another example, the first material layer 1 may be a conductive layer including a conductive material, such as, for example, a doped polysilicon, whereas the second material layer 2 may be a sacrificial layer including undoped polysilicon. In this case, the sacrificial layer may be replaced with an Insulating layer in a subsequent process.

For reference, although not illustrated in the present drawing, a peripheral circuit may be positioned in a lower portion of the stacked structure ST. For example, the peripheral circuit may be positioned in a lower portion of at least one of the first and second contact regions CT1 and CT2 of the stacked structure. In this case, after the peripheral circuit is formed, an interlayer insulating layer covering the peripheral circuit may be formed, whereas the stacked structure ST may be formed on the interlayer insulating layer.

Figure 2B:
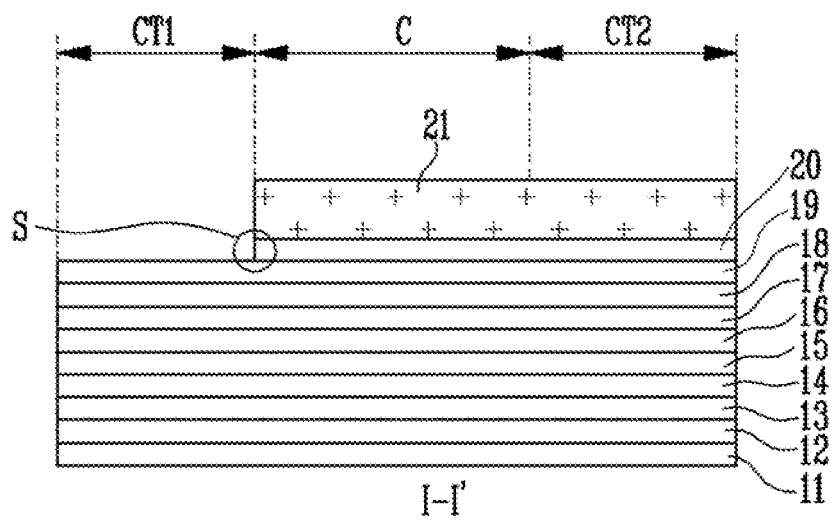

Referring to FIG. 2B, a first mask pattern 21, which covers the cell region C and the second contact region CT2 of the stacked structure ST while leaving exposed the first contact region CT1, may be formed. Next, the stacked structure ST is etched by n layers by using the first mask pattern 21 as an etch barrier. Here, n may be a natural number equal to or greater than 1. Accordingly, a step S may be formed at a boundary of the cell region C and the first contact region CT1.

Because of the step S, the first contact region CT1 and the second contact region CT2 may now have different heights. For example, when n=1, the material layer 20 is exposed in an upper surface of the second contact region CT2 while the material layer 19 is exposed in an upper surface of the first contact region CT1.

Figure 2C:
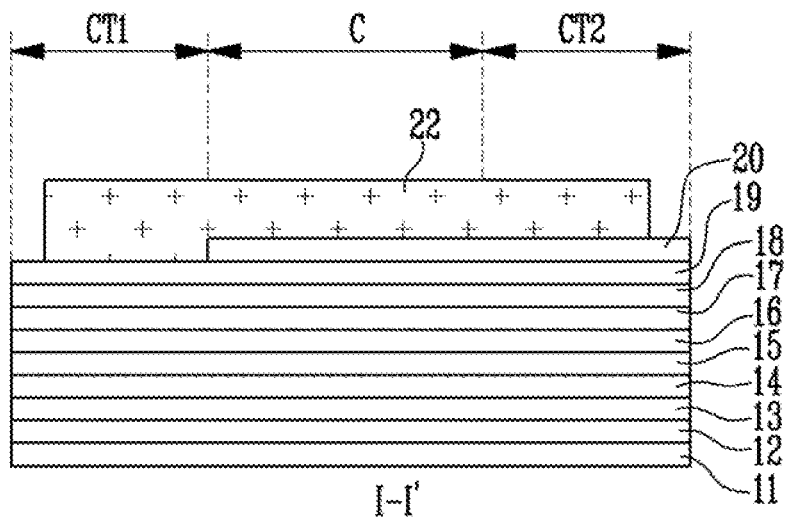

Referring now to FIG. 2C, the first mask pattern 21 may be removed, and a second mask pattern 22 may be formed on the stacked structure ST. The second mask pattern 22 is formed to cover the cell region C and the step S of the stacked structure ST, and may be expanded to partially cover the first and second contact regions CT1 and CT2. For example, the second mask pattern 22 may be expanded up to the first and second contact regions CT1 and CT2 so as to cover a region in the first and second contact regions CT1 and CT2, in which the stacked structure ST is to be patterned in a step form or pad portions of the word lines are to be formed.

Here, the second mask pattern 22 may include a resist. Further, as a thickness of the second mask pattern 22 is decreased during a repetition of shrinking the second mask pattern 22, the second mask pattern 22 may be formed in a sufficient thickness.

Figure 2D:
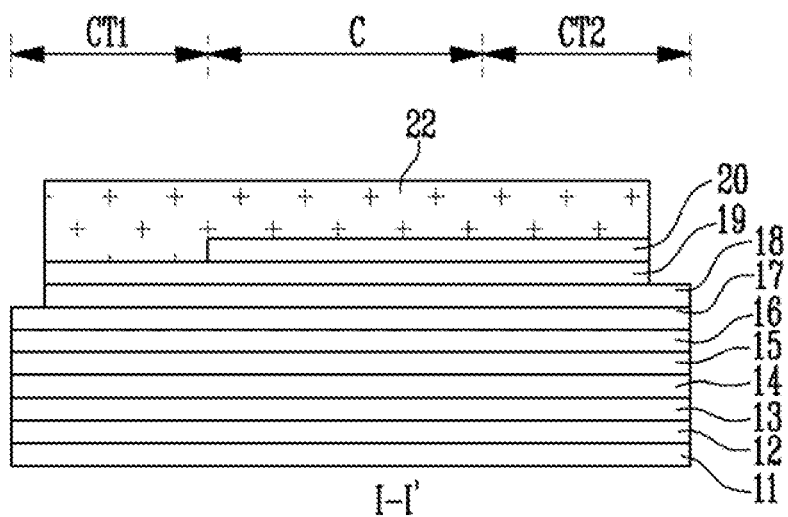

Referring to FIG. 2D, the stacked structure ST may be etched by k layers by using the second mask pattern 22 as an etch barrier. Here, k is a natural number greater than or equal to 2, and may have a value larger than n. For example, k=2n.

In this case, an etch process is performed in a state where the second mask pattern 22 covers the step S, so that the k layers are etched while the step S between the first contact region CT1 and the second contact region CT2 is maintained. For example, when k=2, the layers 18 and 19 are etched in the first contact region CT1 so that the layer 17 is exposed in the first contact region CT1. Further, the layers 20 and 19 are etched in the second contact region CT2 so that the layer 18 is exposed in the second contact region CT2.

Figure 2E:
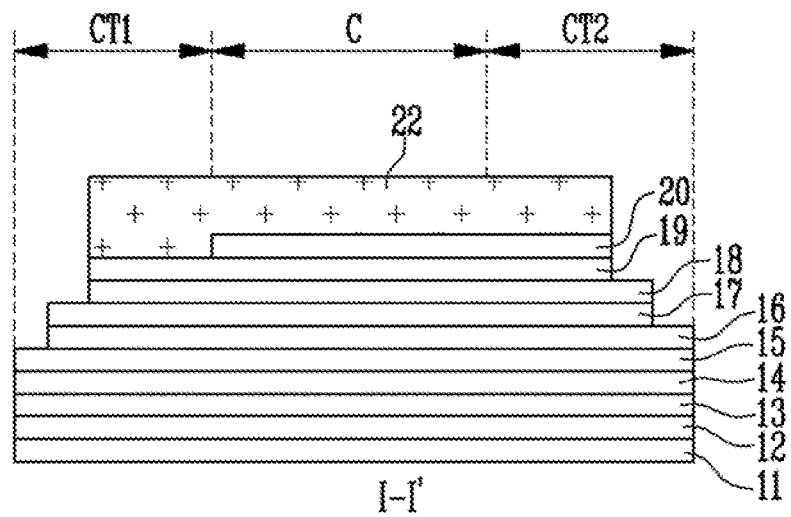
Figure 2F:
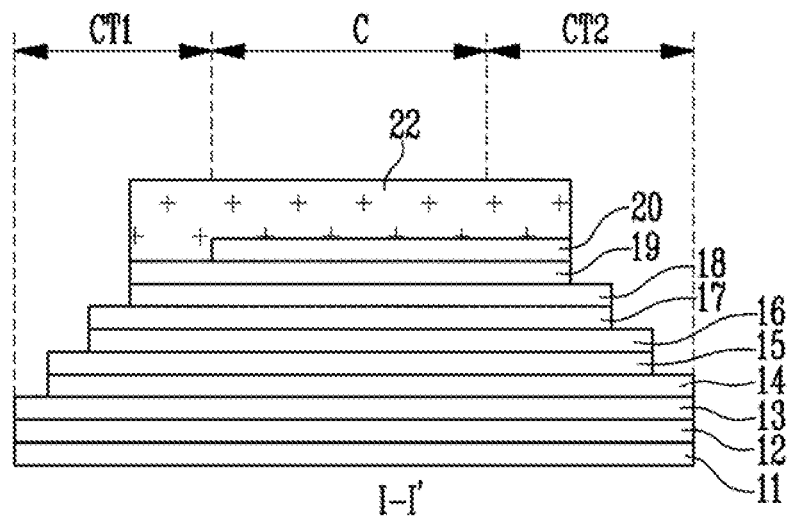
Figure 2G:
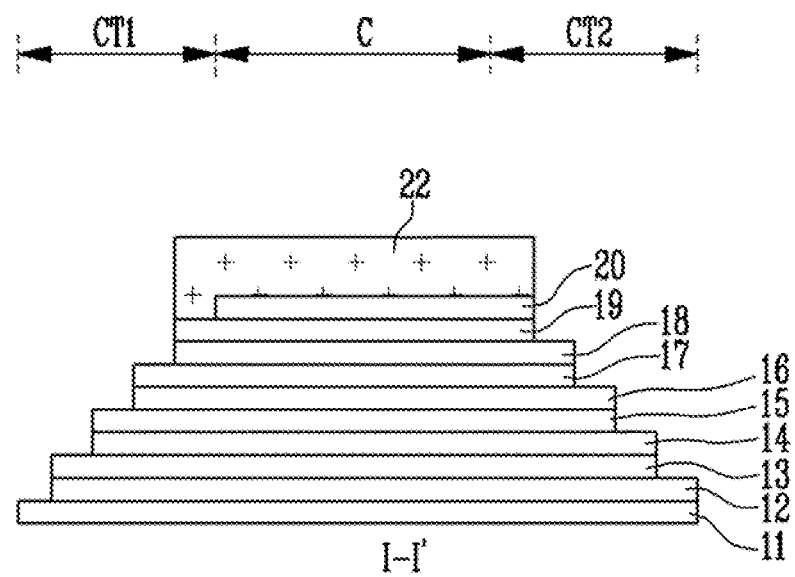

Referring to FIGS. 2E to 2G, the second mask pattern 22 may be further decreased in size to cover a smaller area, and then the stacked structure may be etched by k layers by using the decreased second mask pattern 22 as an etch barrier. Further, the decreasing of the second mask pattern 22 and the etch process of the stacked structure ST may be iterated until all the layers 11 to 20 are exposed either in the first contact region CT1 or the second contact region CT2.

In this case, a width of the pad portion of the word line is determined according to a decreased width of the second mask pattern 22. Accordingly, the decreased width of the second mask pattern 22 may be determined considering an alignment margin of the pad portion and the contact plug. Further, the decreased width may be equally or differently determined according to a degree of the decrease of the second mask pattern 22.

For example, when k=2, as illustrated in FIG. 2E, after the second mask pattern 22 is decreased, the layers 16 to 19 of the first contact region CT1 and the layers 17 to 20 of the second contact region CT2 are etched by using the decreased second mask pattern 22 as an etch barrier. Next, as illustrated in FIG. 2F, after the second mask pattern 22 is decreased, the layers 14 to 19 of the first contact region CT1 and the layers 15 to 20 of the second contact region CT2 are etched by using the decreased second mask pattern 22 as an etch barrier. Next, as illustrated in FIG. 2G, after the second mask pattern 22 is decreased, the layers 12 to 19 of the first contact region CT1 and the layers 13 to 20 of the second contact region CT2 are etched by using the decreased second mask pattern 22 as an etch barrier.

Accordingly, the first and second contact regions CT1 and CT2 of the stacked structure ST are patterned in a step form, and the odd numbered layers 11, 13, 15, 17, and 19 are exposed in the first contact region CT1, and the even numbered layers 12, 14, 16, 18, and 20 are exposed in the second contact region CT2. Here, the exposed region in each of the layers 11 to 20 serves as the pad portion.

Figure 2H:
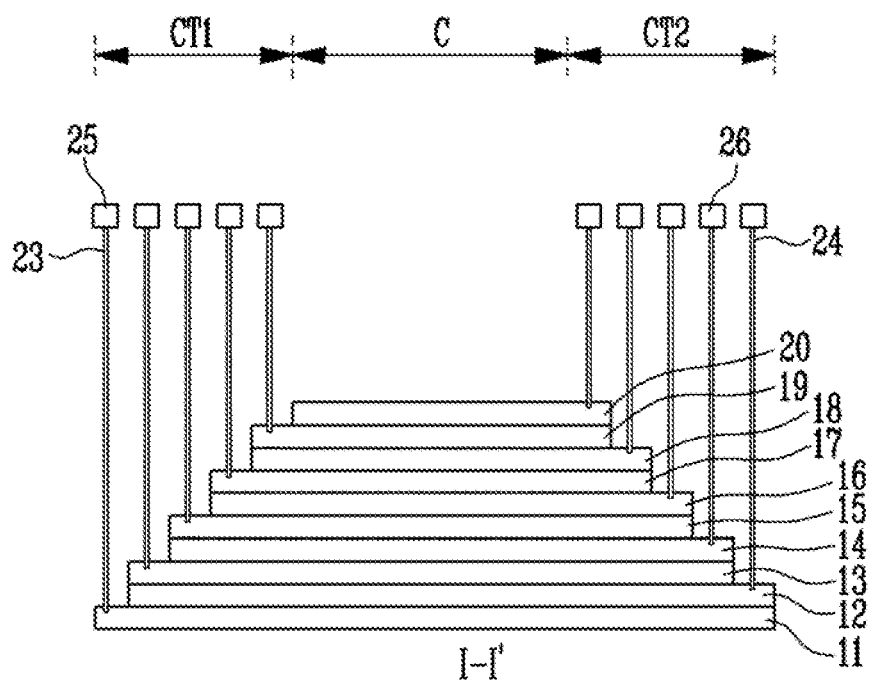

Referring to FIG. 2H, a plurality of first and second contact plugs 23 and 24 are formed so as to be connected to corresponding pad portions of the layers 11 to 20 exposed in the first and second contact regions CT1 and CT2, respectively. For example, the plurality of first contact plugs 23 connected with the respective pad portions of the odd numbered layers are formed in the first contact region CT1, and the plurality of second contact plugs 24 connected with the respective pad portions of the even numbered layers are formed in the second contact region CT2. Further, when each of the layers 11 to 20 includes the first material layer 1 and the second material layer 2 as described with reference to FIG. 2A, the first and second contact plugs 23 and 24 may be formed to be connected to the first material layers 1, respectively.

Next, a plurality of first and second wires 25 and 26 connected with the plurality of first and second contact plugs 23 and 24 may be formed. For example, the plurality of first wires 25 connected with the odd numbered layers 11, 13, 15, 17, and 19 may be formed in the first contact region CT1, and the plurality of second wires 26 connected with the even numbered layers 12, 14, 16, 18, and 20 may be formed in the second contact region CT2.

For reference, although not illustrated in the present drawing, when the peripheral circuit is positioned in the lower portion of the stacked structure ST, a contact plug, a wire, and the like for electrically connecting the layers 11 to 20 of the stacked structure ST and the peripheral circuit may be further formed.

According to the aforementioned process, the step S is formed between the first contact region CT1 and the second contact region CT2 by using the first mask pattern 21 in advance. Accordingly, it is possible to distribute the pad portions of the stacked layers 11 to 20 in the first contact region CT1 and the second contact region CT2, and decrease the number of iterations of the decreasing of the mask and the etch process. Further, it is possible to decrease the areas of the first and second contact regions CT1 and CT2.

FIGS. 3A and 3B to FIGS. 7A and 7B are diagrams for describing a method of manufacturing the semiconductor device according to an embodiment of the present disclosure. FIGS. 3A, 4A, 5A, 6A, and 7A are layouts and FIGS. 3B, 4B, 5B, 6B, and 7B are perspective views.

Figure 3A:
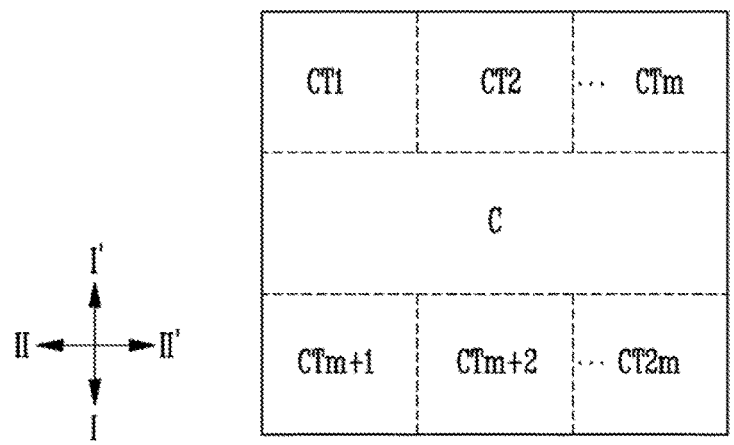
Figure 3B:
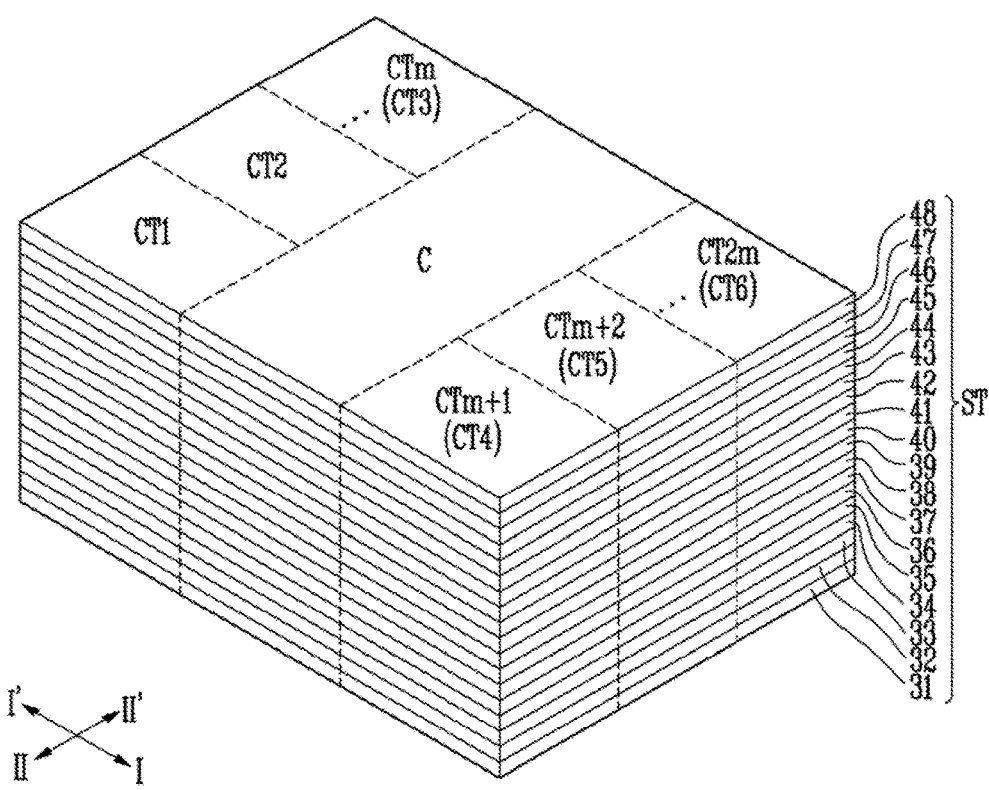

Referring to FIGS. 3A and 3B, a stacked structure ST including a plurality of stacked layers 31 to 48 is formed. The stacked structure ST includes a cell region C and first to $2m^{th}$ contact regions CT1 to CTm, where m is a natural number greater than or equal to 2.

The first to $m^{th}$ contact regions CT1 to CTm are positioned at one side of the cell region C, and the $m+1^{th}$ to $2m^{th}$ contact regions are positioned at the other side of the cell region C. The first to $m^{th}$ contact regions CT1 to CTm are sequentially arranged in the second direction II-II', and the $m+1^{th}$ to $2m^{th}$ contact regions are sequentially arranged in the second direction II-II'. Further, the first contact region CT1, the cell region C, and the $m+1^{th}$ contact region CTm+1 are sequentially arranged in the first direction I-I'. Also, the $m^{th}$ contact region CTm, the cell region C, and the $2m^{th}$ contact region CT$2m$ are sequentially arranged in the first direction I-I'. Hereinafter, in the present exemplary embodiment, a case where m=3 will be described.

Figure 4A:
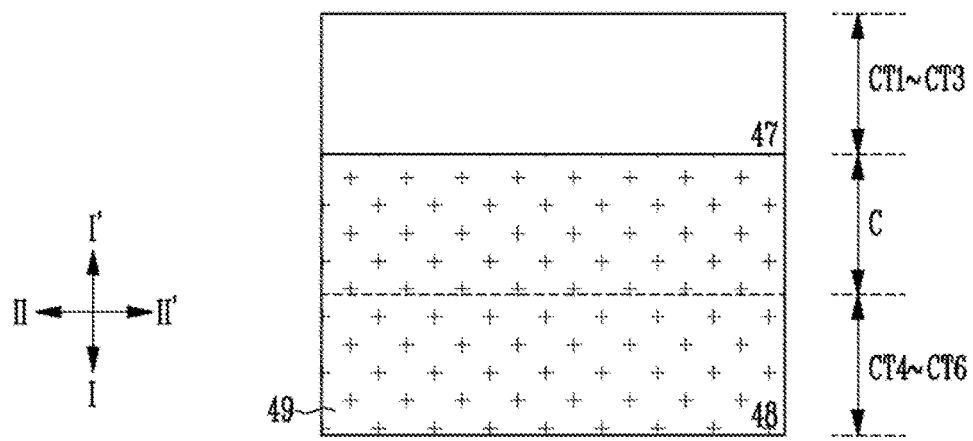
Figure 4B:
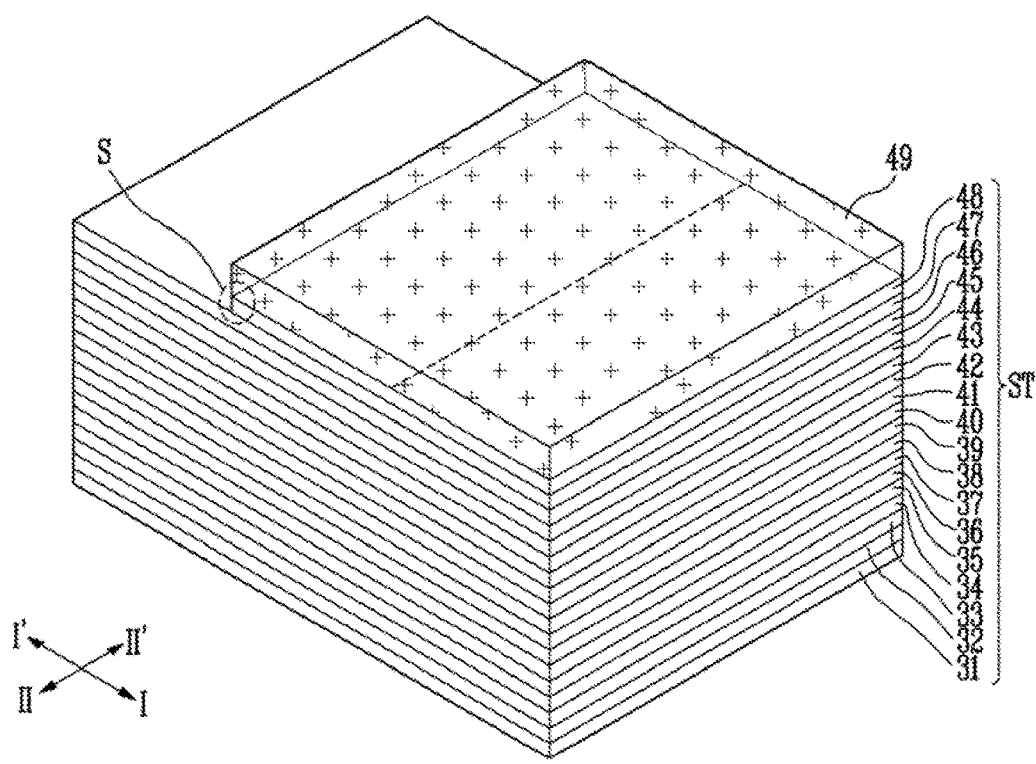

Referring to FIGS. 4A and 4B, a first mask pattern 49, which covers the cell region C and the fourth to sixth contact regions CT4 to CT6 and exposes the first to third contact regions CT1 to CT3, is formed on the stacked structure ST. Next, a step S is formed between the cell region C and the first to third contact regions CT1 to CT3 by etching the stacked structure ST by n layers by using the first mask pattern 49 as an etch barrier. Accordingly, the layer 47 is exposed in the first to third contact regions CT1 to CT3, and the first to third contact regions CT1 to CT3 have a height smaller than the fourth to sixth contact regions CT4 to CT6 by n layers. In the present exemplary embodiment, a case where n=1 will be described.

Figure 5A:
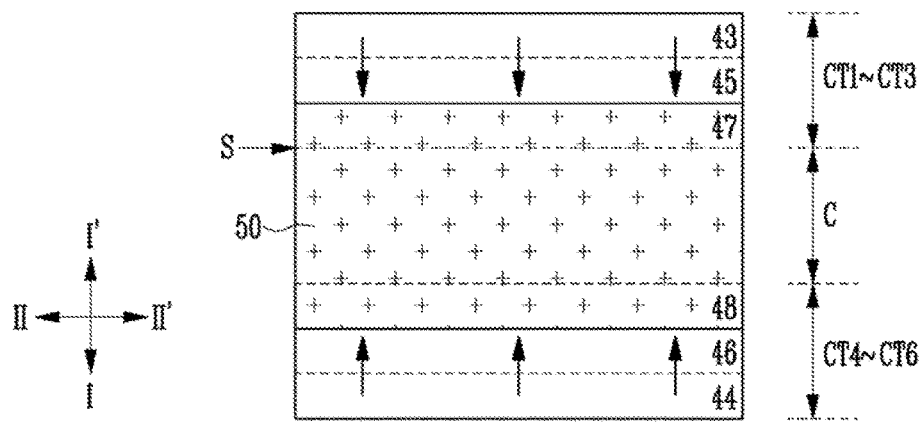
Figure 5B:
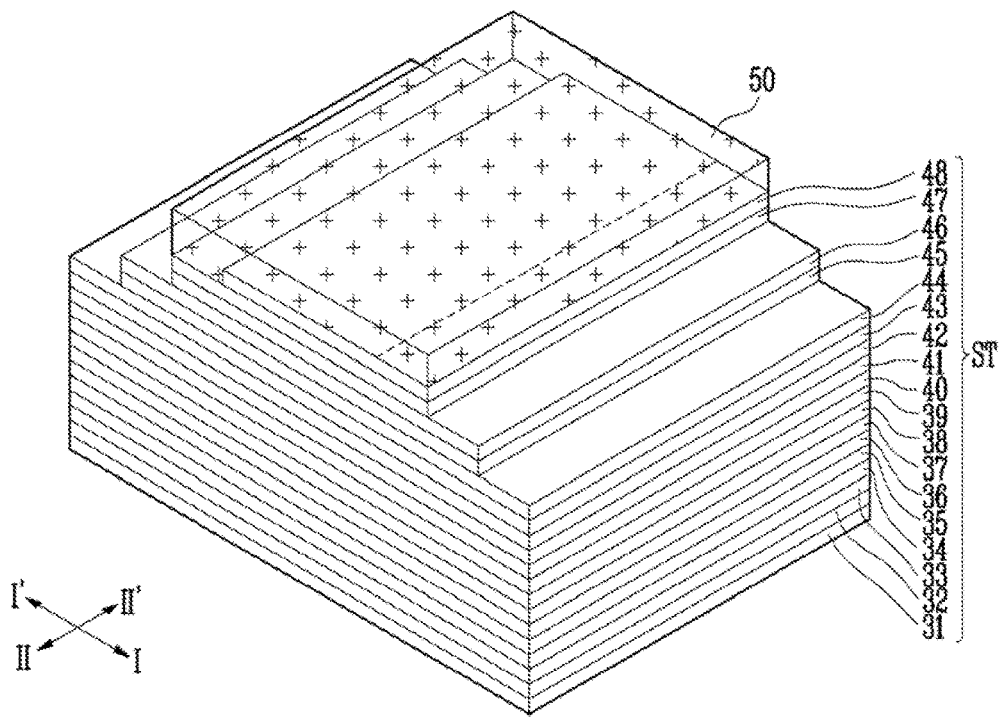

Referring to FIGS. 5A and 5B, after a second mask pattern 50 is formed on the stacked structure ST, a process of etching the stacked structure ST by 2n layers is repeatedly performed while, at each repetition, decreasing the second mask pattern 50 in the first direction I-I'.

Here, the second mask pattern 50 covers the cell region C and the step S, and is expanded to cover a part of the first to third contact regions CT1 to CT3 and a part of the fourth to sixth contact regions CT4 to CT6. Further, during the decrease of the second mask pattern 50, the second mask pattern 50 is decreased in the first direction I-I' so that the exposure of the part of the first to third contact regions CT1 to CT3 and the fourth to sixth contact regions CT4 to CT6 is increased in such a manner that the cell region C and the step S are not exposed. Accordingly, the layers 43, 45, and 47 are exposed in the first to third contact regions CT1 to CT3 and the layers 44, 46, and 48 are exposed in the fourth to sixth contact regions CT4 to CT6.

Referring to FIGS. 6A, 6B, 7A, and 7B, after a third mask pattern 51 is formed on the stacked structure ST, a process of etching the stacked structure ST by 2n layers is repeatedly performed while, at each repetition, decreasing the third mask pattern 51 in the second direction II-II'.

Figure 6A:
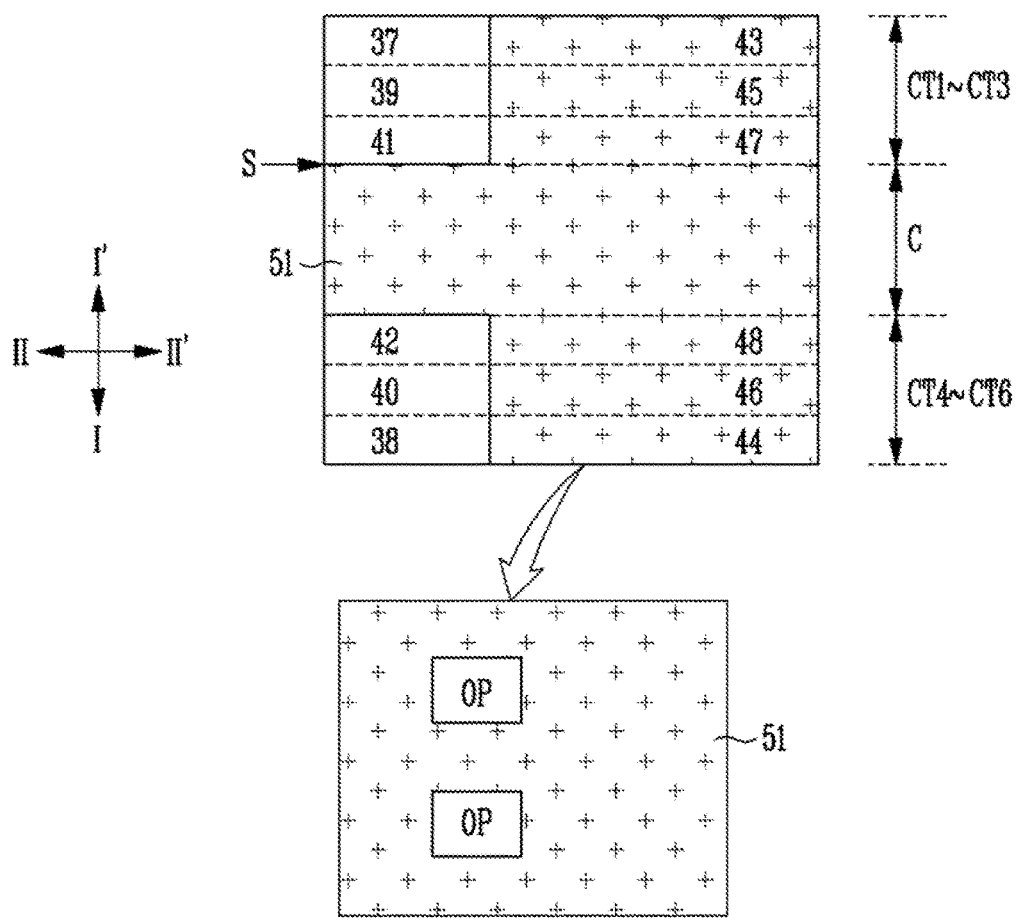
Figure 6B:
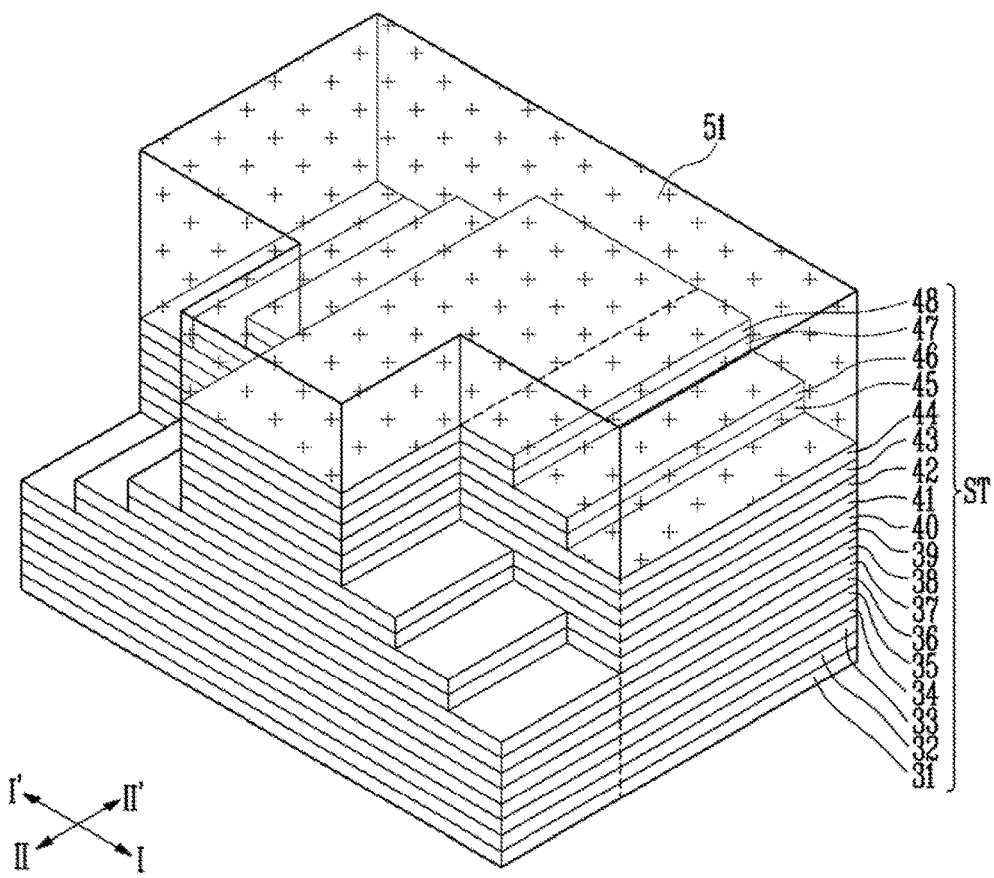

First, referring to FIGS. 6A and 6B, the third mask pattern 51, which covers the cell region C, the second and third contact regions CT2 and CT3, and the fifth and sixth contact regions CT5 and CT6, and exposes the first and fourth contact regions CT1 and CT4, is formed. For example, the third mask pattern 51 may include openings OP in island forms exposing the first and fourth contact regions CT1 and CT4, respectively. Next, the first contact region CT1 and the fourth contact region CT4 are partially etched by using the third mask pattern 51 as an etch barrier. In this case, the number of layers by which the staked material ST is etched each time, is determined according to the number of etch repetitions, the decrease of the second mask pattern 50 for each etch, and the total number of layers 31 to 48 forming the stacked structure ST. In the present exemplary embodiment, a case where the stacked structure ST is etched by 2m layers, wherein 2m=6, will be described. Accordingly, three layers 37, 39, and 41 are exposed in the first contact region CT1, and three layers 38, 40, and 42 are exposed in the fourth contact region CT4.

Figure 7A:
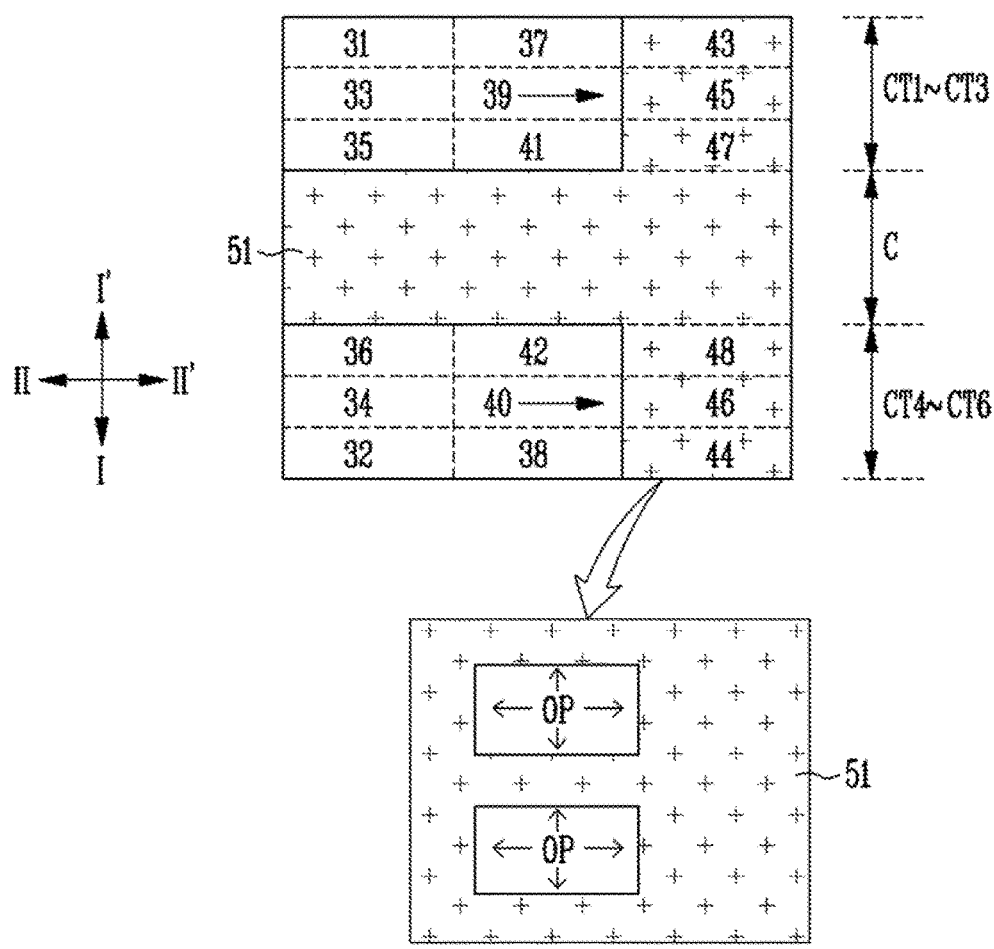
Figure 7B:
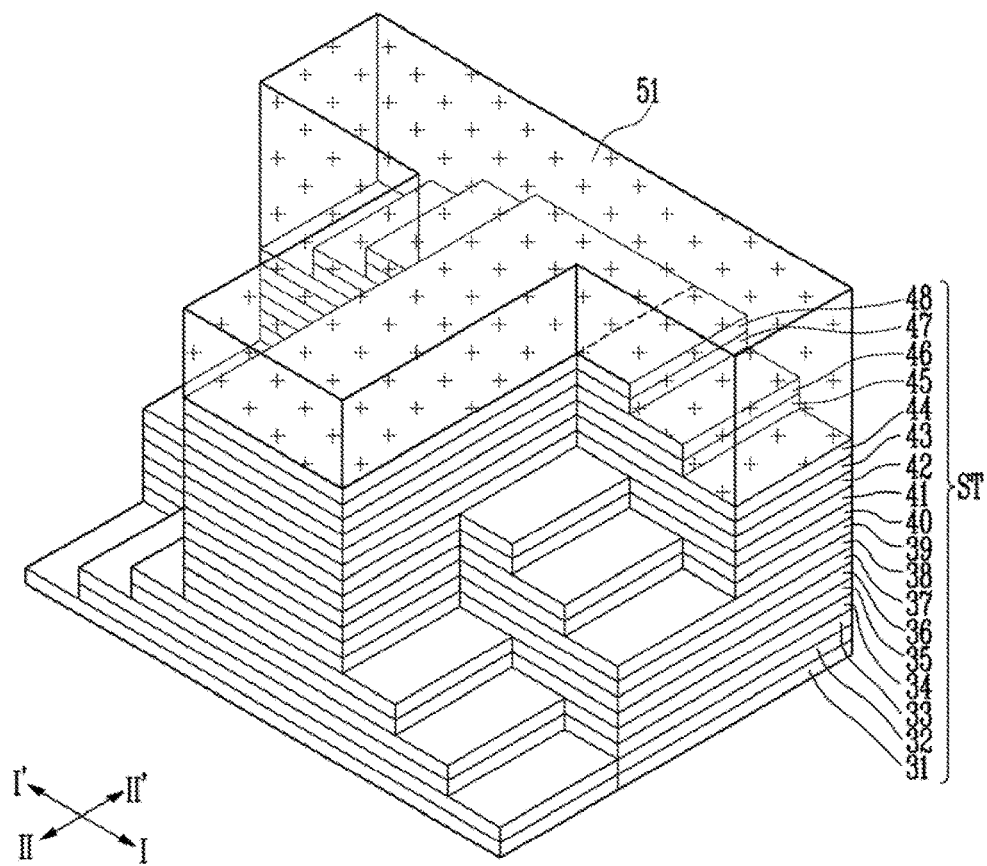

Next, referring to FIGS. 7A and 7B, the third mask pattern 51 is decreased in the second direction II-II' so as to expose the second contact region CT2 and the fifth contact region CT5. In this case, the second contact region CT2 and the fifth contact region CT5 may be exposed by expanding the openings OP by isotropically etching the third mask pattern 51. For reference, when the isotropic etch process is performed, the opening OP may be expanded in the first direction I-I' and thus a dummy region may be present between the cell region C and the contact regions CT1 to CT6 so that the cell region C is not exposed.

Next, the first, second, fourth, and fifth contact regions CT1, CT2, CT4, and CT5 are etched by 2m layers by using the third mask pattern 51 as an etch barrier. Accordingly, the layers 31, 33, and 35 are exposed in the first contact region CT1, the layers 37, 39, and 41 are exposed in the second contact region CT2, the layers 32, 34, and 36 are exposed in the fourth contact region CT4, and the layers 38, 40, and 42 are exposed in the fifth contact region CT5.

According to the aforementioned process, the stacked structure ST has a step structure extending in the first and second directions I-I' and II-II'. Here, the step structure in the first direction I-I' has a step of 2n layers wherein n=1 (e.g., $2n=2$), whereas the step structure in the second direction II-II' has a step of 2m layers wherein m=3 (e.g., 2m=6). Further, the odd numbered layers 31, 35, 37, 39, 41, 43, 45, and 47 are exposed at one side of the cell region C, and the even numbered layers 32, 34, 36, 38, 40, 42, 44, 46, and 48 are exposed at the other side of the cell region C.

FIGS. 8A and 8B to FIGS. 11A and 11B are diagrams for describing a method of manufacturing the semiconductor device according to an embodiment of the present disclosure. FIGS. 8A, 9A, 10A, and 11A are layouts and FIGS. 8BB, 9B, 10B, and 11B are perspective views. Hereinafter, contents already described above will be omitted.

Figure 8A:
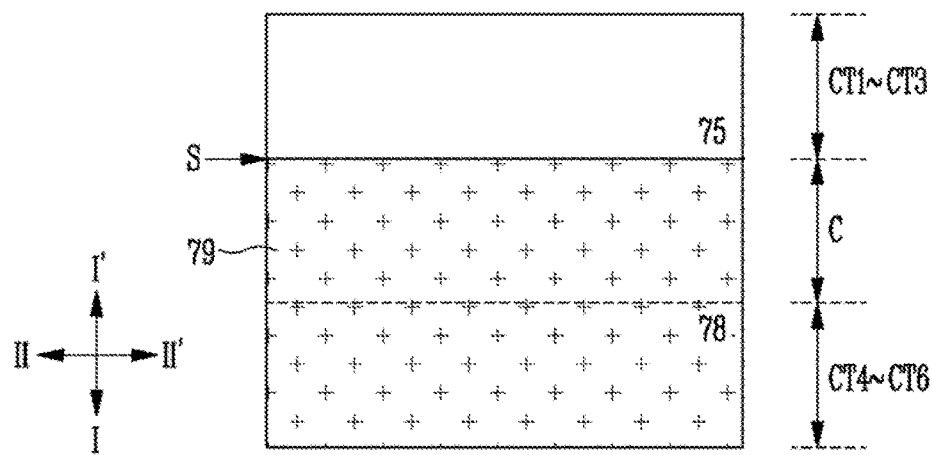
Figure 8B:
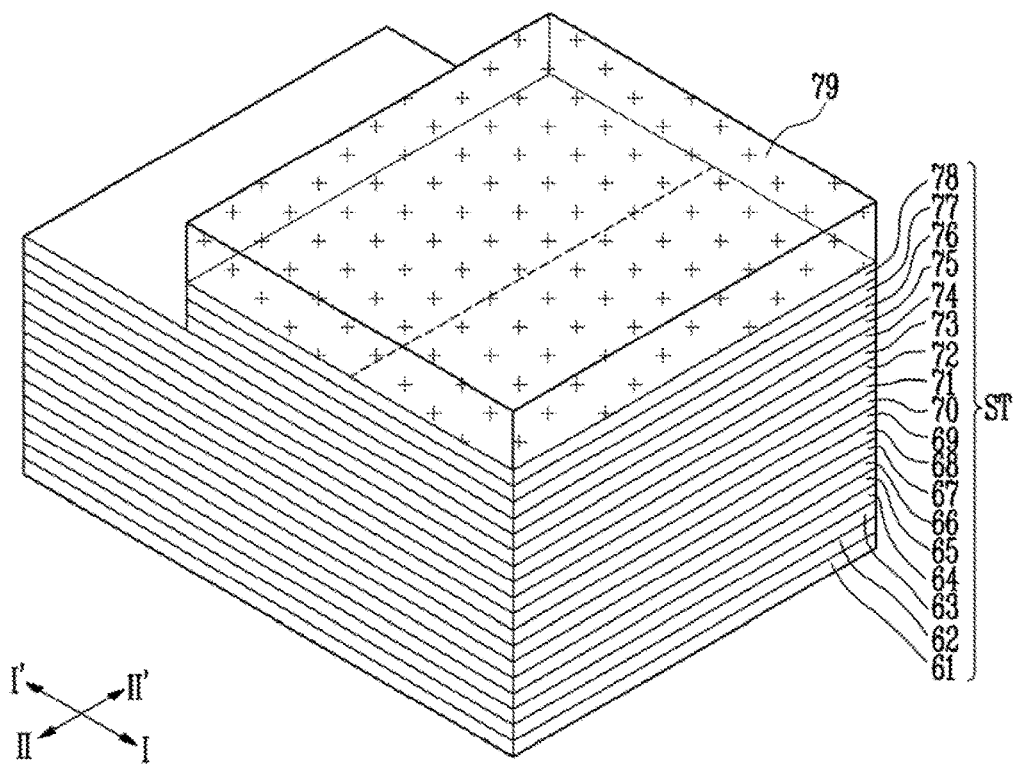

Referring to FIGS. 8A and 8B, a stacked structure ST including a plurality of stacked layers 61 to 78 is formed. Here, the stacked structure includes a cell region C, first to $m^{th}$ contact regions CT1 to CTm arranged at one side of the cell region C, and $m+1^{th}$ to $2m^{th}$ contact regions CTm+1 to CT2m arranged at one side of the cell region C, where m is a natural number greater than or equal to 2. Hereinafter, in the present exemplary embodiment, a case where m=3 will be described.

A first mask pattern 79, which covers the cell region C and the fourth to sixth contact regions CT4 to CT6 and exposes the first to third contact regions CT1 to CT3, is formed on the stacked structure ST. Next, a step S is formed between the cell region C and the first to third contact regions CT1 to CT3 by etching the stacked structure ST by n layers by using the first mask pattern 79 as an etch barrier. Accordingly, the layer 75 is exposed in the first to third contact regions CT1 to CT3, and the first to third contact regions CT1 to CT3 have a height smaller than the fourth to sixth contact regions CT4 to CT6 by n layers. Here, n may be a natural number greater than or equal to 1, and m=n. In the present exemplary embodiment, a case where n=3 will be described.

Figure 9A:
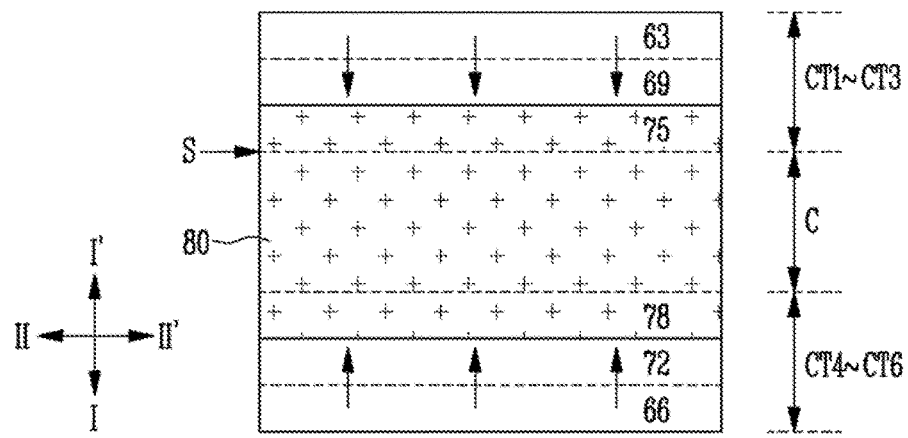
Figure 9B:
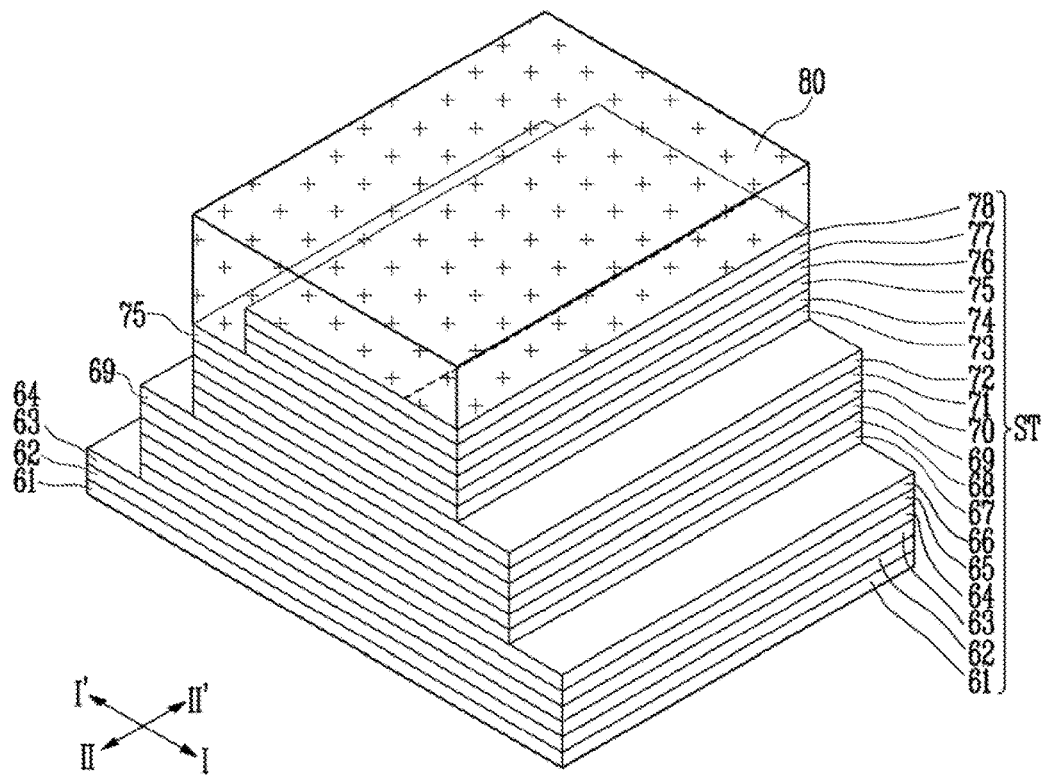

Referring to FIGS. 9A and 9B, after a second mask pattern 80 is formed on the stacked structure ST, a process of etching the stacked structure ST by 2n layers is repeatedly performed while, at each repetition, decreasing the second mask pattern 80 in the first direction I-I'.

Here, the second mask pattern 80 covers the cell region C and the step S, and is expanded to cover a part of the first to third contact regions CT1 to CT3 and a part of the fourth to sixth contact regions CT4 to CT6. Further, during the decrease of the second mask pattern 80, the second mask pattern 80 is decreased in the first direction I-I' so that the exposure of the part of the first to third contact regions CT1 to CT3 and the fourth to sixth contact regions CT4 to CT6 is increased in such a manner that the cell region C and the step S are not exposed. Accordingly, the layers 63, 69, and 75 are exposed in the first to third contact regions CT1 to CT3 and the layers 66, 72, and 78 are exposed in the fourth to sixth contact regions CT4 to CT6.

Referring to FIGS. 10A, 10B, 11A, and 11B, a third mask pattern 81 is formed on the stacked structure ST, and then a process of etching the stacked structure ST by 2n layers is repeatedly performed while, at each repetition, decreasing the third mask pattern 81 in the second direction II-II'.

Figure 10A:
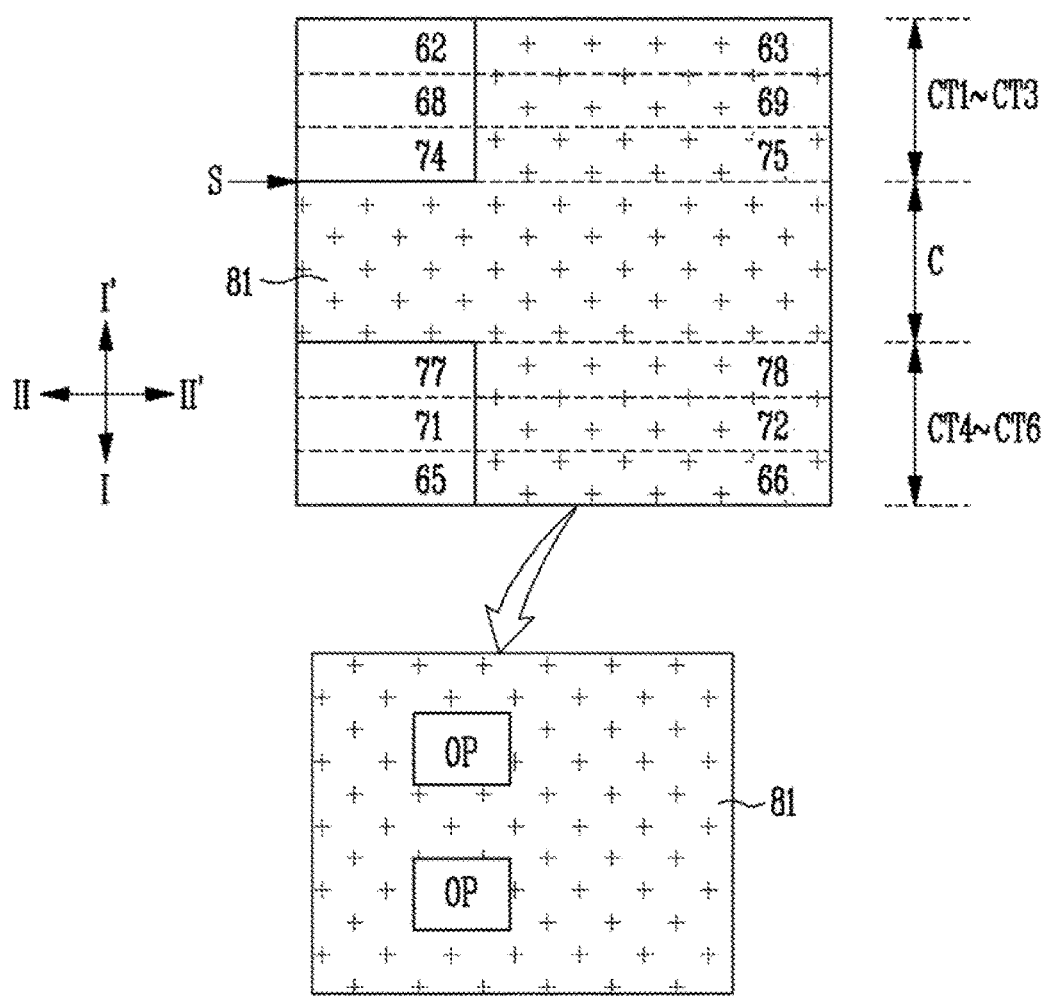
Figure 10B:
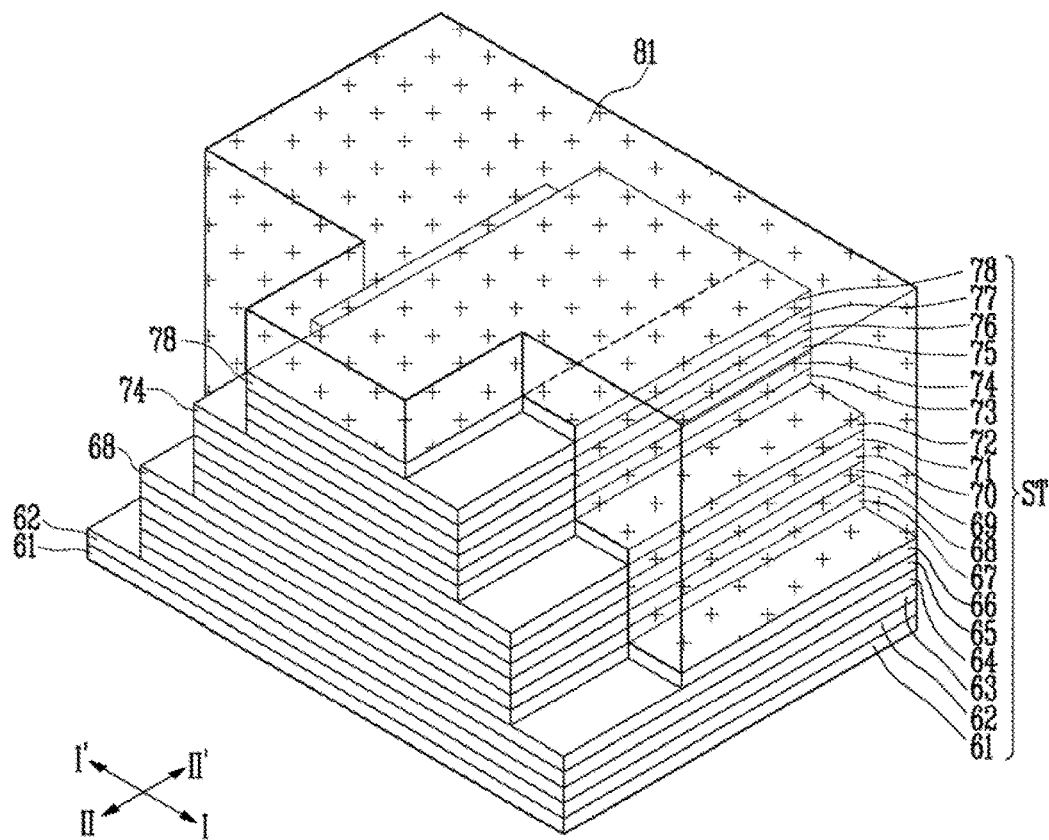

First, referring to FIGS. 10A and 10B, the third mask pattern 81, which covers the cell region C, the second and third contact regions CT2 and CT3, and the fifth and sixth contact regions CT5 and CT6, and exposes the first and fourth contact regions CT1 and CT4, is formed. As described above with reference to FIG. 6A, the third mask pattern 81 may include openings OP in island forms exposing the first and fourth contact regions CT1 and CT4, respectively. Next, the first contact region CT1 and the fourth contact region CT4 are etched by one layer by using the third mask pattern 81 as an etch barrier. Accordingly, the layers 62, 68, and 74 are exposed in the first contact region CT1, and layers 65, 71, and 77 are exposed in the fourth contact region CT4.

Figure 11A:
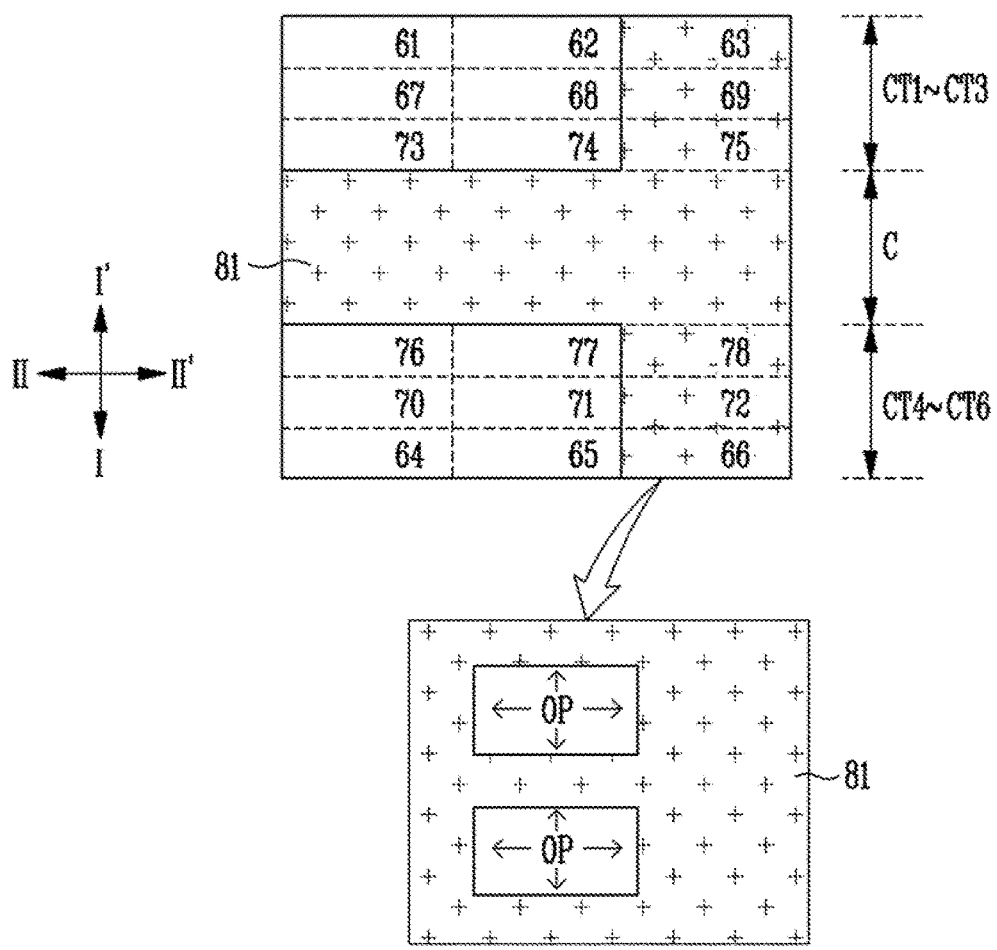
Figure 11B:
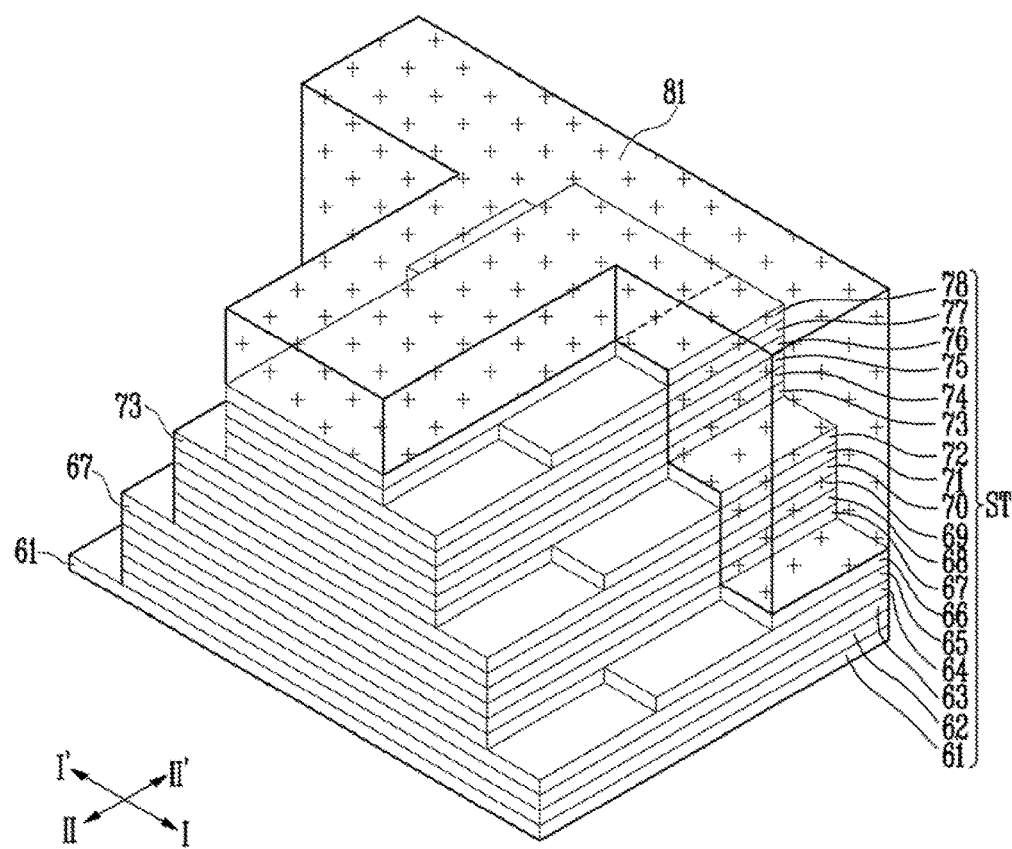

Next, referring to FIGS. 11A and 11B, the third mask pattern 81 is decreased in the second direction II-II' so as to expose the second contact region CT2 and the fifth contact region CT5. In this case, as described above with reference to FIG. 7A, the second contact region CT2 and the fifth contact region CT5 may be exposed by expanding the openings OP by isotropically etching the third mask pattern 81. Further, a dummy region may be present between the cell region C and the contact regions CT1 to CT6.

Next, the first, second, fourth, and fifth contact regions CT1, CT2, CT4, and CT5 are etched by one layer by using the third mask pattern 81 as an etch barrier. Accordingly, the layers 61, 67, and 73 are exposed in the first contact region CT1, the layers 62, 68, and 74 are exposed in the second contact region CT2, the layers 63, 69, and 75 are exposed in the third contact region CT3, the layers 64, 70, and 76 are exposed in the fourth contact region CT4, the layers 65, 71, and 77 are exposed in the fifth contact region CT5, and the layers 66, 72, and 78 are exposed in the sixth contact region CT6.

According to the aforementioned process, the stacked structure ST has a step structure extending in the first direction I-I' and the second direction II-II'. Here, the step structure in the first direction I-I' has a step of 2n layers (e.g., 2n=6), and the step structure in the second direction II-II' has a step of one layer. Further, the layers 61 to 63, 67 to 69, and 73 to 75 are exposed at one side of the cell region C, and the layers 64 to 66, 70 to 72, and 76 to 78 are exposed at the other side of the cell region C.

FIGS. 12A to 12E are perspective views for describing a method of manufacturing the semiconductor device, according to an embodiment of the present disclosure, and relate to an embodiment, in which an upper select line is patterned by using a first mask pattern. Hereinafter, contents already described above will be omitted.

Figure 12A:
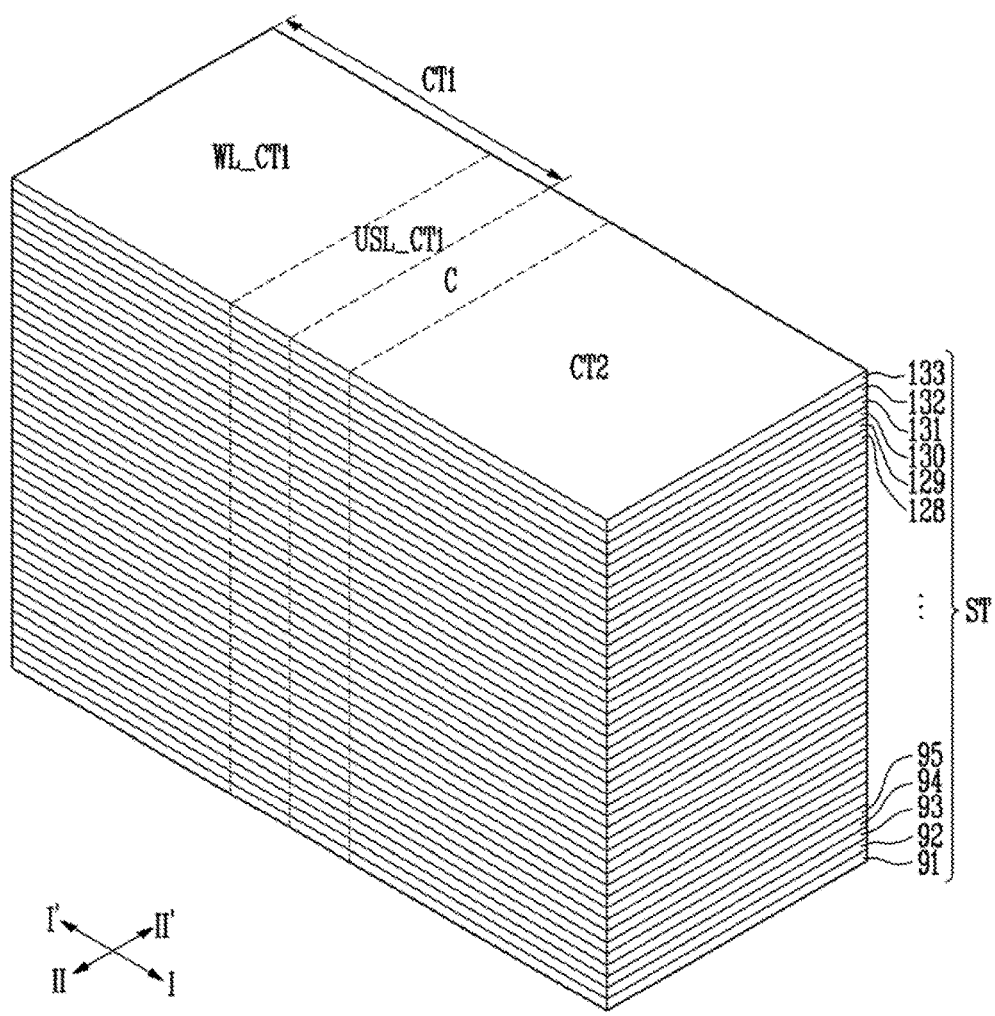
FIGS. 12A to 12E are perspective views for describing a method of manufacturing the semiconductor device, according to an embodiment of the present disclosure.

Referring to FIG. 12A, a stacked structure ST including a plurality of layers 91 to 133 is formed. At least one layer at the topmost portion among the stacked layers 91 to 133 is a material layer for an upper select line, at least one layer at the lowermost portion among the stacked layers 91 to 133 is a material layer for a lower select line, and the remaining layers are material layers for word lines. For example, the three layers 131 to 133 in the topmost portion may be material layers for an upper select line.

The stacked structure includes a cell region C, and first and second contact regions CT1 and CT2 positioned at both sides of the cell region C. Here, the first contact region CT1 may include a first contact region WL_CT1 for the word line and a first contact region USL_CT1 for the upper select line. Here, the first contact region USL_CT1 for the upper select line may be positioned between the first contact region WL_CT1 for the word line and the cell region C. Further, the second contact region CT2 may be a contact region for the word line. For example, the first contact region WL_CT1 for the word line, the first contact region USL_CT1 for the upper select line, the cell region C, and the second contact region CT2 may be sequentially arranged in the first direction I-I', in the recited order.

Figure 12B:
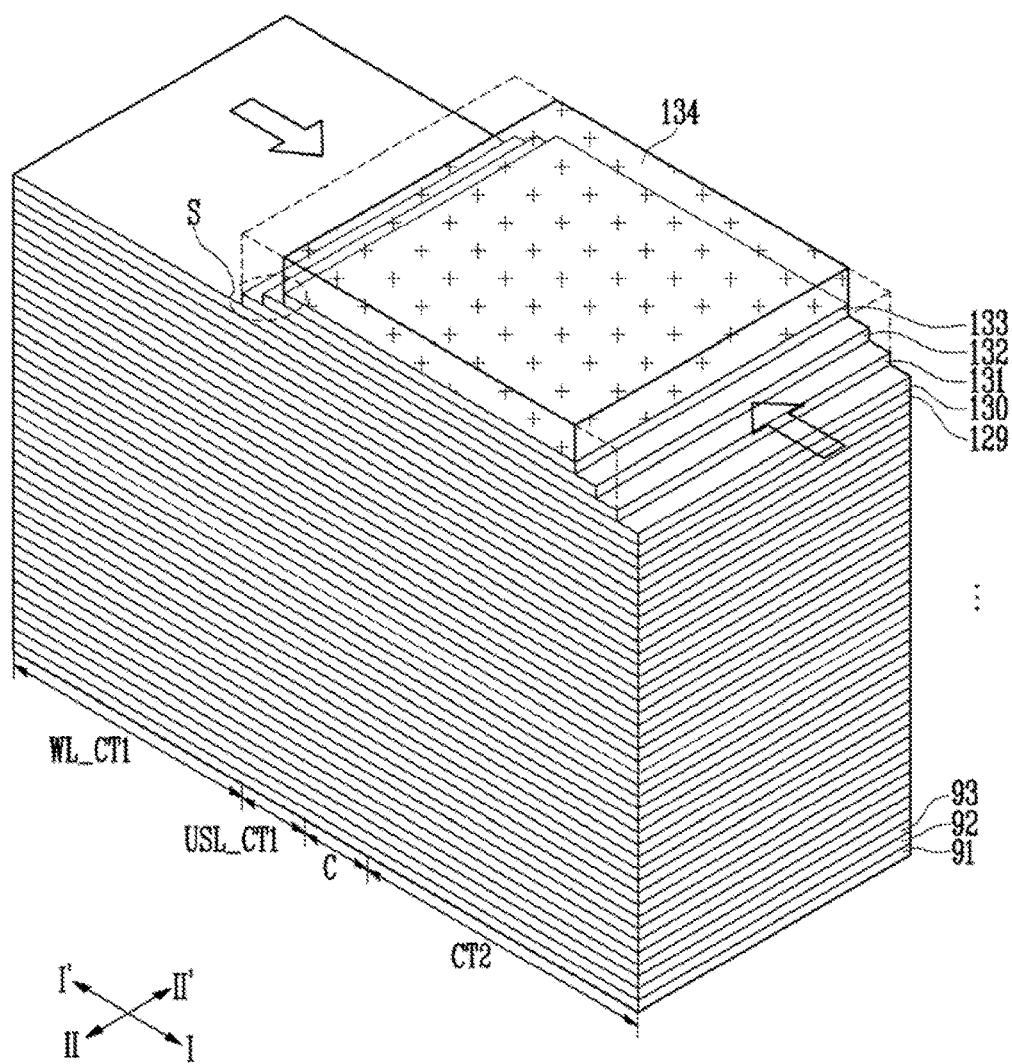

Referring to FIG. 12B, a first mask pattern 134, which covers the cell region C, the first contact region USL_CT1 for the upper select line, and the second contact region CT2 of the stacked structure ST and exposes the first contact region WL_CT1 for the word line, is formed. Here, the first mask pattern 134 is provided for forming a step S between the first contact region CT1 and the cell region C, and may also be utilized as a mask for patterning the upper select line. Accordingly, a process of etching the stacked structure by n layers (e.g., n=1) is repeated while, at each repetition, decreasing the first mask pattern 134 in the first direction I-I'. Accordingly, the plurality of steps S is formed in the first contact region USL_CT1 for the upper select line so that the layers 131 and 132 are sequentially exposed. For reference, even the second contact region CT2 may be partially exposed and patterned during the process of decreasing the first mask pattern 134.

Figure 12C:
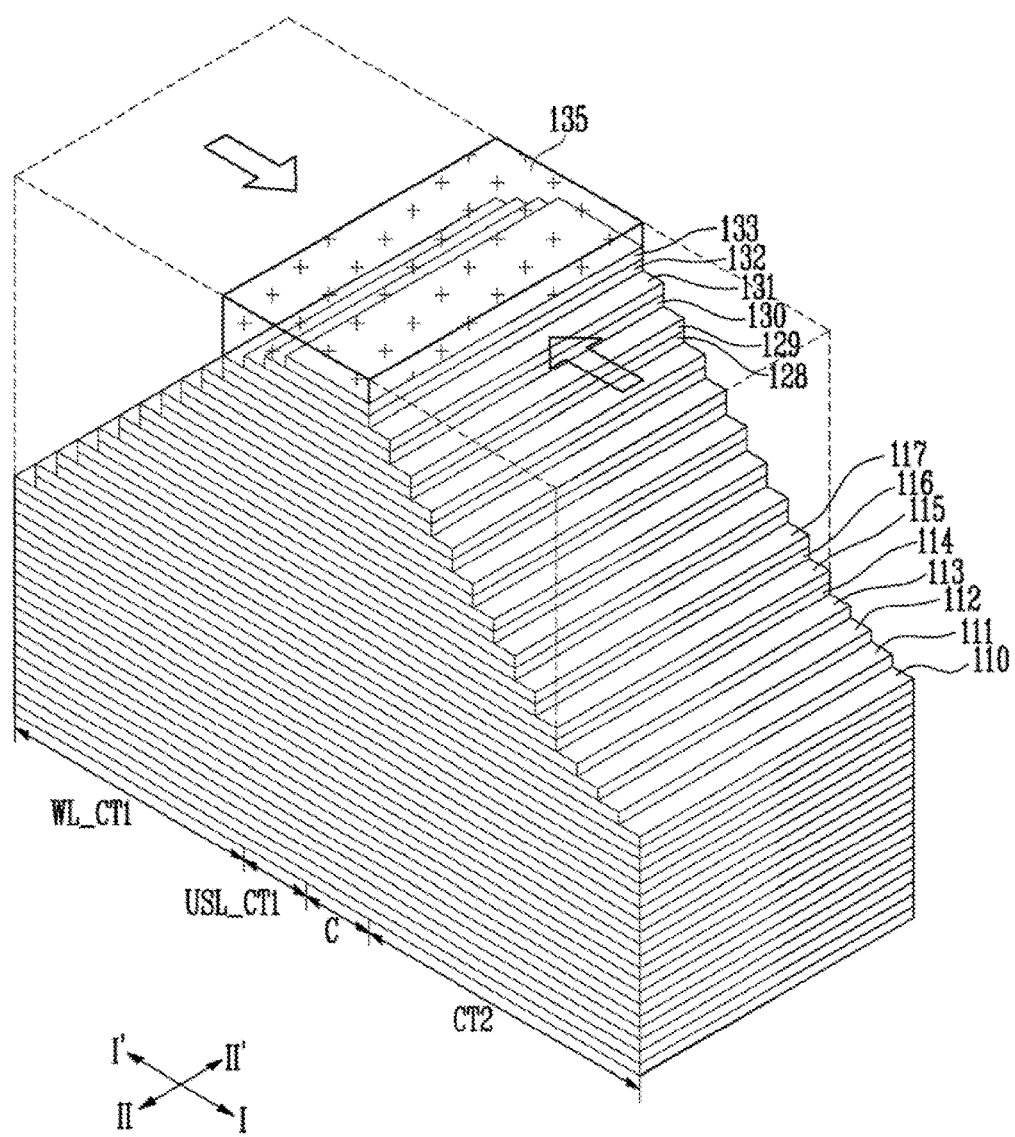

Referring to FIG. 12C, after the first mask pattern 134 is removed, a second mask pattern 135 is formed on the stacked structure ST. The second mask pattern 135 is formed to cover the cell region C, the steps S, and the first contact region USL_CT1 for the upper select line of the stacked structure ST, and may be expanded to the first and second contact regions CT1 and CT2 so as to partially cover the first and second contact regions CT1 and CT2. For example, the second mask pattern 135 may be expanded up to the first and second contact regions CT1 and CT2 so as to cover a region in the first and second contact regions CT1 and CT2, in which the stacked structure ST is to be patterned in a step form or pad portions of the word lines are to be formed.

Next, a process of etching the stacked structure by k layers (e.g., k=2n=2) is repeated while, at each repetition, decreasing the second mask pattern 135 in the first direction I-I'. Accordingly, the even numbered layers 110 to 130 are exposed in the first contact region CT1 for the word line, and the odd numbered layers 111 to 131 are exposed in the second contact region CT2.

Figure 12D:
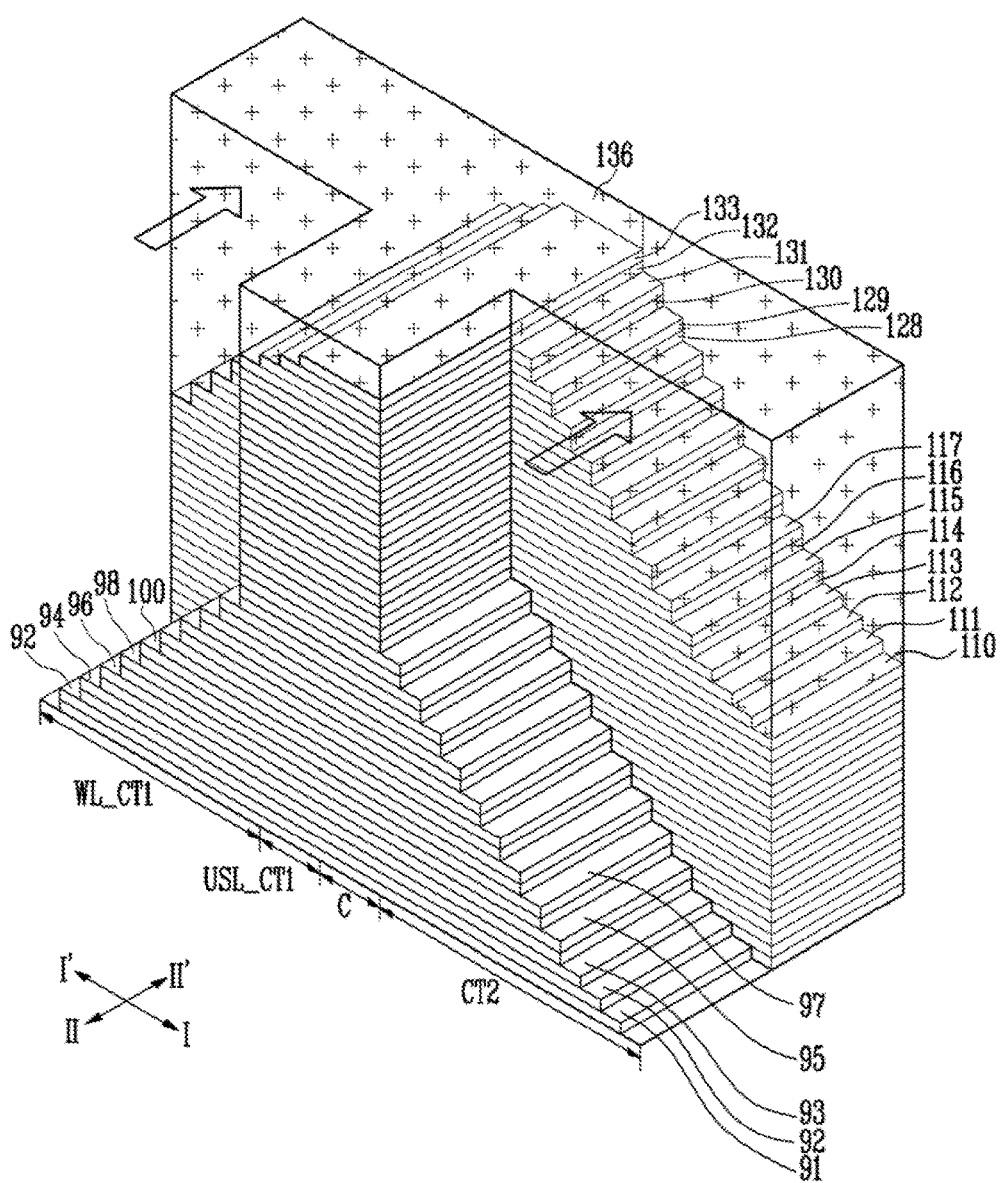

Referring to FIG. 12D, after the second mask pattern 135 is removed, a third mask pattern 136 is formed on the stacked structure ST. The third mask pattern 136 is formed so as to completely cover the cell region and the first contact region USL_CT1 for the upper select line, and partially covers the first contact region WL_CT1 for the word line and the second contact region CT2.

Next, the stacked structure ST is partially etched while, at each repetition, decreasing the third mask pattern 136 in the second direction II-II'. In this case, the number of layers, by which the staked material ST is etched, is determined according to the number etch repetitions, the decrease of the second mask pattern 133 for each etch, and the number of layers 91 to 133 stacked in the stacked structure ST. In the present exemplary embodiment, the stacked structure ST is etched by 20 layers by using the third mask pattern 136 as an etch barrier. Accordingly, the first contact region USL_CT1 for the upper select line is patterned in a step form having a step of one layer in the first direction I-I'. Further, the first contact region WL_CT1 for the word line and the second contact region CT2 are patterned in a step form having steps of two layers in the first direction I-I', and steps of 20 layers in the second direction II-II'.

Figure 12E:
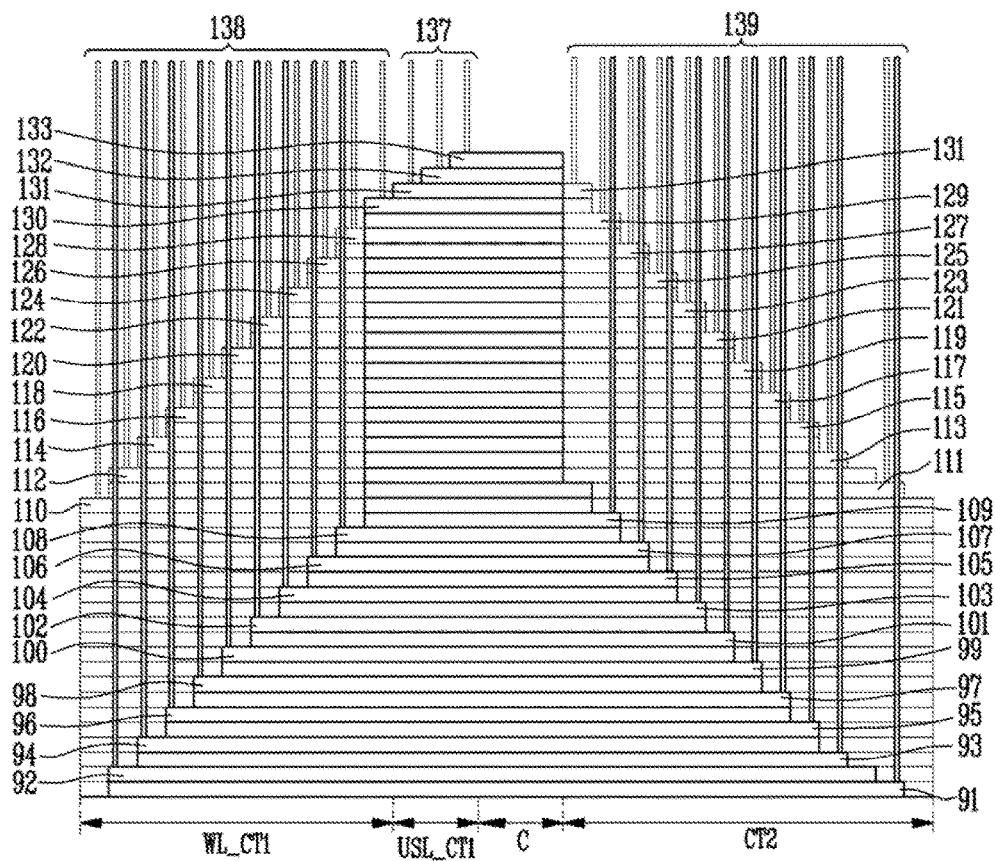

Referring to FIG. 12E, a first plurality of contact plugs 137 connected with the layers exposed in the first contact region USL_CT1 for the upper select line, a second plurality of contact plugs 138 connected with the layers exposed in the first contact region WL_CT1 for the word line, and a third plurality of contact plugs 139 connected with the layers exposed in the second contact region CT2 are formed. For example, the even numbered layers of the lower stacked structure ST and the even numbered layers of the upper stacked structure ST may be connected with the second plurality of contact plugs 138 in the first contact region WL_CT1 for the word line, and the odd numbered layers of the lower stacked structure ST and the odd numbered layers of the upper stacked structure ST may be connected with the third plurality of contact plugs 139 in the second contact region CT2. Next, first to third plurality of wires (not illustrated), which are connected with the first to third plurality of contact plugs 137 to 139, respectively, may be formed.

Figure 13:
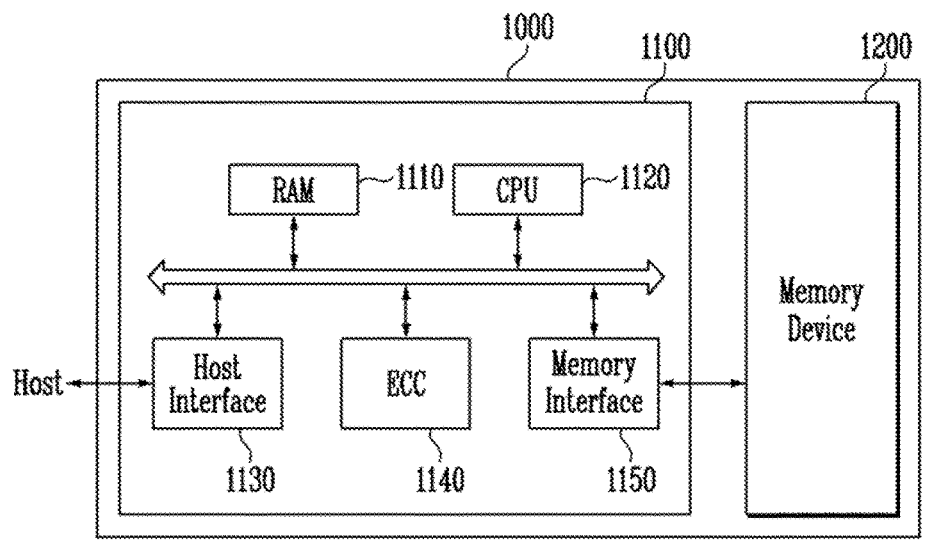
FIGS. 13 and 14 are block diagrams illustrating a configuration of a memory system, according to an embodiment of the present disclosure.

FIG. 13 is a block diagram illustrating a configuration of a memory system, according to an embodiment of the present disclosure.

Referring to FIG. 13, a memory system 1000 according to an embodiment of the present disclosure may include a memory device 1200 and a controller 1100.

The memory device 1200 is used for storing data information having various data forms, such as text, graphic, and software codes. The memory device 1200 may be a non-volatile memory, and may be manufactured by the manufacturing method described above with reference to FIGS. 1A to 11B. A structure and the manufacturing method of the memory device 1200 are the same as those described above, so that detailed descriptions thereof will be omitted.

The controller 1100 may be connected to a host and the memory device 1200, and may be configured to access the memory device 1200 in response to a request from the host. For example, the controller 1100 may be configured to control at least one of a read, write, erase, and background operations of the memory device 1200.

The controller 1100 may include a Random Access Memory (RAM) 1100, a Central Processing Unit (CPU) 1120, a host interface 1130, an Error Correction Code (ECC) circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For example, the RAM 1100 may be replaced with a Static Random Access Memory (SRAM), a Read Only Memory (ROM), and the like.

The CPU 1120 may be configured to control a general operation of the controller 1100. For example, the CPU 1120 may be configured to operate a firmware, such as a Flash Translation Layer (FTL), stored in the RAM 1110.

The host interface 1130 may be configured to perform interfacing with the host. For example, the controller 1100 may communicate with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, and an Integrated Drive Electronics (IDE) protocol, and a private protocol.

The ECC circuit 1140 may be configured to detect and correct an error included in data read from the memory device 1200 by using an ECC.

The memory interface 1150 may be configured to perform interfacing with the memory device 1200. For example, the memory interface 1150 includes a NAND interface or a NOR interface.

For example, the controller 1100 may further include a buffer memory (not illustrated) for storing temporarily data. For example, the buffer memory may be used for storing temporarily data transmitted to the outside (e.g., a device external to the controller such as the host) through the interface 1130. As another example, the buffer memory may be used for storing temporarily data transmitted from the memory device 1200 through the memory interface 1150. Further, the controller 1100 may further include a ROM for storing code data for interfacing with the host.

As described above, the memory system 1000 according to an embodiment of the present disclosure includes the memory device 1200 with an improved degree of integration and improved manufacturing yield, thereby improving a characteristic of the memory system 1000.

Figure 14:
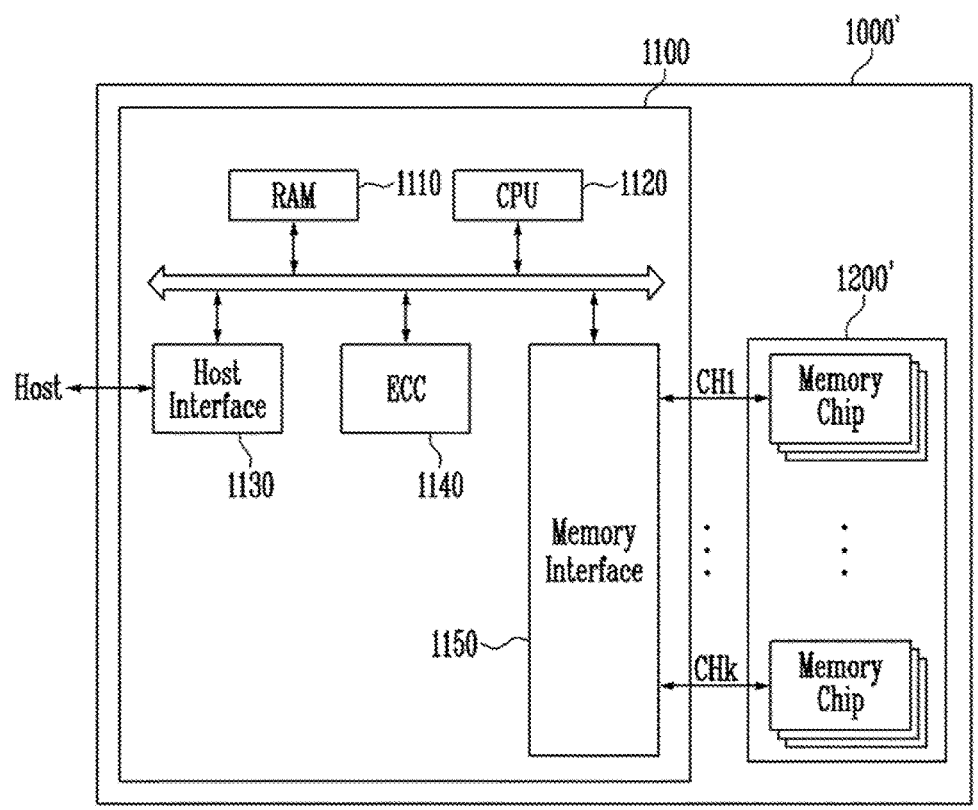

FIG. 14 is a block diagram illustrating a configuration of a memory system, according to an embodiment of the present disclosure. Hereinafter, contents overlapping the aforementioned description will be omitted.

As illustrated in FIG. 14, a memory system 1000', according to an embodiment of the present disclosure, may include a memory device 1200' and a controller 1100. Further, the controller 1100 may include a RAM 1110, a CPU 1120, a host interface 1130, an ECC circuit 1140, a memory interface 1150, and the like.

The memory device 1200' may be a non-volatile memory, and may be manufactured by the manufacturing method described above with reference to FIGS. 1A to 11B. A structure and the manufacturing method of the memory device 1200' are the same as those described above, so that detailed descriptions thereof will be omitted.

The memory device 1200' may be a multi-chip package formed of a plurality of memory chips. The plurality of memory chips may be divided into a plurality of groups, each group configured to communicate with the controller 1100 through first to $k^{th}$ channels CH1 to CHk. The memory chips included in each group may be configured to communicate with the controller 1100 through a common channel. For example, the memory system 1000' may be modified so that one memory chip is connected to one channel.

As described above, the memory system 1000' according to an embodiment of the present disclosure includes the memory device 1200' with an improved degree of integration and improved manufacturing yield, thereby improving a characteristic of the memory system 1000'. Further, the memory device 1200' is formed in the multi-chip package, so that it is possible to increase a data storage capacity of the memory system 1000' and improve a driving speed.

Figure 15:
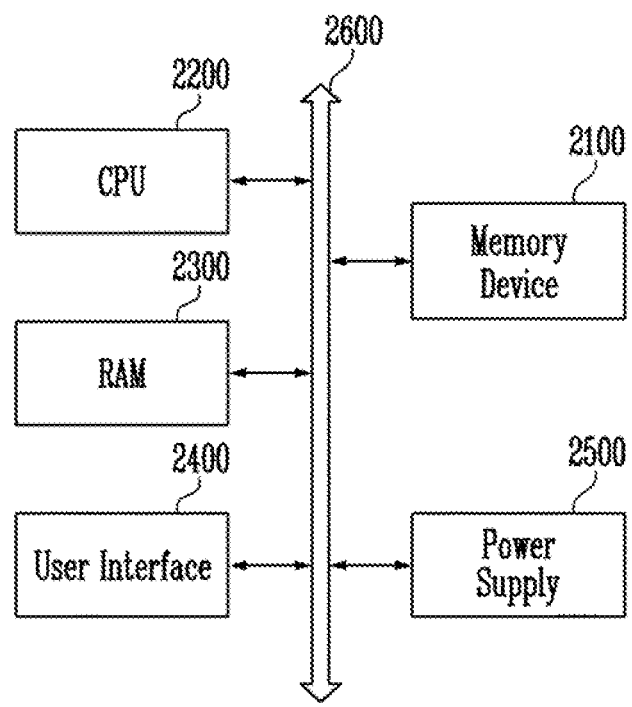
FIGS. 15 and 16 are block diagrams illustrating a configuration of a computing system, according to an embodiment of the present disclosure.

FIG. 15 is a block diagram illustrating a configuration of a computing system, according to an embodiment of the present disclosure. Hereinafter, contents overlapping the aforementioned description will be omitted.

As illustrated in FIG. 15, a computing system 200 according to an embodiment of the present disclosure may include a memory device 2100, a CPU 2200, a RAM 2300, a user interface 2400, a power supply 2500, a system bus 2600, and the like.

The memory device 2100 may store data provided through the user interface 2400, data processed by the CPU 2200, and the like. Further, the memory device 2100 may be connected electrically to the CPU 2200, the RAM 2300, the user interface 2400, and the power supply 2500 through the system bus 2600. For example, the memory device 2100 may be connected to the system bus 2600 through a controller (not illustrated). Or also, as an example, the memory device 2100 may be directly connected to the system bus 2600. When the memory device 2100 is directly connected to the system bus 2600, a function of the controller may be performed by the CPU 2200, the RAM 2300, and the like.

Here, the memory device 2100 may be a non-volatile memory. The memory device 2100 may be manufactured by the manufacturing method described above with reference to FIGS. 1A to 11B. A structure and the manufacturing method of the memory device 2100 are the same as those described above, so that detailed descriptions thereof will be omitted.

Further, the memory device 2100 may be a multi-chip package formed of a plurality of memory chips as described above with reference to FIG. 14.

The computing system 2000 including the aforementioned configuration may include a computer, an Ultra Mobile PC (UMPC), a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3D television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, and the like.

As described above, the computing system 2000 according to an embodiment of the present disclosure includes the memory device 2100 with an improved degree of integration and improved manufacturing yield, thereby improving a characteristic of the computing system 2000.

Figure 16:
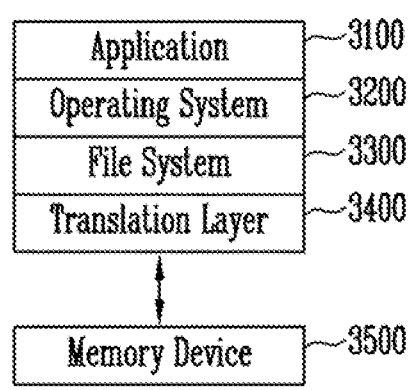

FIG. 16 is a block diagram illustrating a computing system, according to an embodiment of the present disclosure.

As illustrated in FIG. 16, a computing system 3000 according to an embodiment of the present disclosure may include a software layer including an operating system 3200, an application 3100, a file system 3300, a translation layer 3400, and the like. Further, the computing system 3000 may include a hardware layer, such as a memory device 3500.

The operating system 3200 is provided for managing software and hardware sources, and the like of the computing system 3000, and may control an execution of a program of a CPU. The application 3100 may be or include various application programs executed in the computing system 3000. The application 3100 may be a utility executed by the operating system 3200.

The file system 3300 may include a logical structure for managing data, a file, and the like present in the computing system 3000. The file system 3300 may organizes a file or data to be stored in the memory device 3500 and the like according to a rule. The file system 3300 may be determined by the operating system 3200 used in the computing system 3000. For example, when the operating system 3200 is a series of Windows of the Microsoft Company, the file system 3300 may be a File Allocation Table (FAT), a NT file system (NTFS), and the like. Further, when the operating system 3200 is a series of Unix/Linux, the file system 3300 may be an Extended File System (EXT), a Unix File System (UFS), a Journaling File System (JFS), and the like.

In the present drawing, the operating system 3200, the application 3100, and the file system 3300 are illustrated as separate blocks. However, we note that the application 3100 and the file system 3300 may be included in the operating system 3200.

The translation layer 3400 may translate an address into a form appropriate to the memory device 3500 in response to a request from the file system 3300. For example, the translation layer 3400 may translate a logic address generated by the file system 300 into a physical address of the memory device 3500. For example, mapping information of the logic address and the physical address may be stored in an address translation table. For example, the translation layer 3400 may be a Flash Translation Layer (FTL), a Universal Flash Storage Link Layer (ULL), and the like.

The memory device 3500 may be a non-volatile memory, and may be manufactured by the manufacturing method described above with reference to FIGS. 1A to 11B. A structure and the manufacturing method of the memory device 3500 are the same as those described above, so that detailed descriptions thereof will be omitted.

The computing system 3000 including the aforementioned configuration may be divided into an operating system layer performed in a high level region and a controller layer performed in a low level region. For example, the application 3100, the operating system 3200, and the file system 3300 may be included in the operating system layer, and may be driven by an operation memory of the computing system 300. Further, the translation layer 3400 may be included in the operating system layer or the controller layer.

As described above, the computing system 3000, according to an embodiment of the present disclosure, may include the memory device 3500 with an improved degree of integration and improved manufacturing yield, thereby improving a characteristic of the computing system 3000.

Although the present invention has been described according to the aforementioned embodiments, these embodiments have been described for illustration purposes only and are not intended to limit the present invention. Those skilled in the art will appreciate that various other embodiments and variations thereof may be made within the technical spirit and scope of the present invention.

What is claimed is:

1. A method of manufacturing a semiconductor device, comprising:
   forming a stacked structure including a plurality of layers, the stacked structure including a cell region, and first and second contact regions positioned at either side of the cell region;
   forming a first mask pattern covering the cell region and the second contact region of the stacked structure, while leaving exposed the first contact region;
   forming steps of n layers at a boundary of the cell region and the first contact region by etching the stacked structure by n layers by using the first mask pattern as an etch barrier, where n is a natural number greater than or equal to 1;
   forming a second mask pattern on the stacked structure, wherein the second mask covers the cell region and the formed steps and is expanded to partially cover the first and second contact regions; and
   etching the stacked structure by k layers by using the second mask pattern as an etch barrier, where k is a natural number greater than or equal to 2, wherein the etching of the stacked structure by the k layers is repeatedly performed while, at each repetition, decreasing the second mask pattern so that the exposure of the first contact region and the second contact region is increased.

2. The method of claim 1, wherein the decreased second mask pattern covers the cell region and the step.

3. The method of claim 1,
   wherein the decreasing of the second mask pattern and the etching of the stacked structure by the k layers are repeatedly performed so that odd numbered layers among the layers are exposed in the first contact region and even numbered layers among the layers are exposed in the second contact region, and
   wherein n is 1 and k is 2.

4. The method of claim 1, wherein k is 2n.

5. The method of claim 1, further comprising:
   forming a first plurality of contact plugs connected with respective layers which are exposed in the first contact region; and
   forming a plurality of second contact plugs connected with respective layers which are exposed in the second contact region.

6. The method of claim 5, further comprising:
   forming a first plurality of wires connected with the first plurality of contact plugs in the first contact region, respectively; and
   forming a second plurality of wires connected with the second plurality of contact plugs in the second contact region.

7. The method of claim 1,
   wherein the forming of the stacked structure includes forming a first plurality of material layers and a second plurality of material layers, which are alternately stacked, and
   wherein each of the first and second pluralities of layers includes one first material layer and one second material layer.

8. The method of claim 1, wherein each of the first plurality of contact regions includes a first contact region for a word line, and a first contact region for an upper select line positioned between the first contact region for the word line and the cell region.

9. The method of claim 8,
   wherein the first mask pattern covers the first contact region for the upper select line, the cell region, and the second contact region of the stacked structure, and
   wherein the first mask pattern exposes the first contact region for the word line.

10. The method of claim 9, wherein the etching of the stacked structure by the n layers by using the first mask pattern as the etch barrier is repeatedly performed while, at each repetition, decreasing the first mask pattern so that the exposure of the first contact region for the upper select line is increased.

11. The method of claim 10, wherein the step is formed in the first contact region for the upper select line.

12. The method of claim 1, wherein the cell region is a substantially central region and the first and second contact regions are formed at the periphery of the cell region.

13. A method of manufacturing a semiconductor device, comprising:
   forming a stacked structure, which includes a cell region, first to $m^{th}$ contact regions positioned at one side of the cell region, and $m+1^{th}$ to $2m^{th}$ contact regions positioned at the other side of the cell region, and in which a plurality of layers are stacked, where m is a natural number greater than or equal to 2;
   forming a first mask pattern covering the cell region and the $m+1^{th}$ to $2m^{th}$ contact regions of the stacked structure, and exposing the first to $m^{th}$ contact regions;
   forming a step of n layers by etching the stacked structure by the n layers, where n is a natural number greater than or equal to 1, by using the first mask pattern as an etch barrier, wherein the step is located at boundaries of the cell region and the first to $m^{th}$ contact regions;
   forming a second mask pattern on the stacked structure, wherein the second mask pattern covers the cell region and the step and is expanded to partially cover the first to $2m^{th}$ contact regions;
   repeatedly performing a process of etching the stacked structure by 2n layers by using the second mask pattern as an etch barrier several times while, at each repetition, decreasing the second mask pattern in a first direction so that the exposure of the first to $m^{th}$ contact regions and the $m+1^{th}$ to $2m^{th}$ contact regions is increased;

forming a third mask pattern covering the cell region, the second to $m^{th}$ contact regions, and the $m+2^{th}$ to $2m^{th}$ contact regions of the stacked structure; and repeatedly performing a process of partially etching the stacked structure by using the third mask pattern as an etch barrier while, at each repetition, decreasing the third mask pattern in a second direction crossing the first direction so that the second to $m^{th}$ contact regions and the $m+2^{th}$ to $2m^{th}$ contact regions are sequentially exposed.

14. The method of claim 13, wherein n is 1, and wherein a process of etching the stacked structure by using the third mask pattern as an etch barrier is repeatedly performed by 2m layers.

15. The method of claim 13, wherein n is 2 or more, and wherein a process of etching the stacked structure by using the third mask pattern as an etch barrier is repeatedly performed by one layer.

\* \* \* \* \*